(12) United States Patent
Wattyn

(10) Patent No.: US 12,704,786 B2

(45) Date of Patent: *Aug. 11, 2026

(54) APPARATUS AND METHOD FOR TREATING AND TRANSPORTING A RELIEF PRINTING PLATE PRECURSOR

(71) Applicant: XSYS Prepress N.V., Ypres (BE)

(72) Inventor: Bart Wattyn, Dentergem (BE)

(73) Assignee: XEIKON PREPRESS N.V., Ypres (BE)

( * ) Notice: Subject to any disclaimer, the term of this patent is extended or adjusted under 35 U.S.C. 154(b) by 19 days.

This patent is subject to a terminal disclaimer.

(21) Appl. No.: 18/486,754

(22) Filed: Oct. 13, 2023

(65) Prior Publication Data

US 2024/0036472 A1 Feb. 1, 2024

Related U.S. Application Data

(63) Continuation of application No. 17/050,076, filed as application No. PCT/EP2019/060365 on Apr. 23, 2019, now Pat. No. 11,953,834.

(30) Foreign Application Priority Data

Apr. 26, 2018 (NL) ..................................... 2020835
Apr. 26, 2018 (NL) ..................................... 2020836

(51) Int. Cl.
*G03F 7/30* (2006.01)
*B41N 3/00* (2006.01)
*G03F 7/26* (2006.01)

(52) U.S. Cl.
CPC ............. *G03F 7/3064* (2013.01); *B41N 3/00* (2013.01); *G03F 7/26* (2013.01)

(58) Field of Classification Search
CPC ............ G03F 7/26; G03F 7/3064; B41N 3/00
See application file for complete search history.

(56) References Cited

U.S. PATENT DOCUMENTS 3,102,632 A * 9/1963 Moser .................... B21D 43/04 493/369
11,953,834 B2 * 4/2024 Wattyn .................. G03F 7/3064
12,078,932 B2 * 9/2024 Wattyn ................... B41N 3/006
2012/0067235 A1 * 3/2012 Odle ........................ B41N 6/00 101/486
2018/0217502 A1 * 8/2018 Dietz .................... G03F 7/3057
2018/0329303 A1 * 11/2018 De Caria ............. G03F 7/2032

FOREIGN PATENT DOCUMENTS

DE 4231103 A1 * 3/1994 ........... G03F 7/3064
JP H0580537 A * 4/1993

* cited by examiner

*Primary Examiner* — Jill E Culler
(74) *Attorney, Agent, or Firm* — KDW Firm PLLC

(57) ABSTRACT

An apparatus for preparing a relief plate precursor, such as a printing plate precursor, that has to be treated. The apparatus includes a transport bar provided with at least one penetration element, preferably a plurality of penetration elements; and a plate coupling station configured for coupling a relief plate precursor to the transport bar by causing a penetration by the at least one penetration element through an unperforated area near an edge of a relief plate precursor.

17 Claims, 10 Drawing Sheets

100
101
121
100

102
122
120
113
111
112
110
120
100

APPARATUS AND METHOD FOR TREATING AND TRANSPORTING A RELIEF PRINTING PLATE PRECURSOR

CROSS-REFERENCE TO RELATED APPLICATION

This is a continuation of pending U.S. nonprovisional patent application Ser. No. 17/050,076, filed Oct. 23, 2020, which is a national stage filing under 35 U.S.C. 371 of international patent application PCT/EP2019/060365, filed Apr. 23, 2019, which claims priority to Netherlands Patent application serial numbers NL2020835, filed Apr. 26, 2018, and NL2020836, filed Apr. 26, 2018, the entirety of which applications are incorporated by reference herein.

FIELD OF INVENTION

The field of the invention relates to apparatus and methods for preparing and/or treating a relief plate precursor, in particular a printing plate precursor.

BACKGROUND

Washer apparatus for printing plate precursors are known. Typically, a transport bar is used to move a printing plate precursor through such a washer apparatus. To that end an area of the printing plate precursor is provided with a series of through holes in a perforating station. Next an operator couples the pre-perforated printing plate precursor to a transport bar having a plurality of pins which can extend in the holes of the printing plate. The transport bar with the coupled plate is then brought by the operator to an inlet side of the washer apparatus. The transport bar leaves the washer apparatus at an outlet side, where it is recuperated by an operator who decouples it from the printing plate precursor. These steps are repeated for the next printing plate precursor to be washed. A disadvantage of the known apparatus and methods is that quite a large number of manual operations are required, resulting in a rather slow process. Further, a separate perforating station is required where material is removed out of the printing plate precursor, generating waste.

SUMMARY

The object of embodiments of the invention is to provide apparatus and methods for preparing and/or treating a printing plate precursor allowing to reduce the number of required manual interventions and preferably to reduce the amount of generated waste.

According to a first aspect of the invention there is provided an apparatus for treating a relief plate precursor, such as a printing plate precursor, preferably with a liquid. The apparatus comprises a transport system with at least one, preferably at least two transport bars; a plate coupling station configured for coupling a relief plate precursor to the transport bar; a treatment compartment configured for treating the relief plate precursor, preferably with a liquid; and a plate decoupling station configured for decoupling the treated relief plate precursor from the transport bar. The transport system is configured to automatically move each transport bar, after being coupled to a relief plate precursor in the plate coupling station, from the plate coupling station through the treatment station to the plate decoupling station, and, after being decoupled from a treated relief plate precursor, from the plate decoupling station back to the plate coupling station, such that the transport bar moves in a closed loop through the apparatus.

In other words, using an apparatus of the invention the transport bar or bars can circulate automatically in the apparatus. An operator may bring the relief plate precursor to be treated to the plate coupling station, and next the coupling, treating and decoupling is performed automatically whereupon the transport bar is automatically returned to the plate coupling station. In that way an operator does not have to decouple or return the transport bar. This reduces the number of required manual interactions.

According to a preferred embodiment, each transport bar is provided with at least one penetration element, and the plate coupling station is configured to engage the at least one penetration element in an area near an edge of a relief plate precursor. More preferably, each penetration element has a sharp tip or edge capable of causing a penetrating action in the material of the relief plate precursor, and the plate coupling station is configured to cause a penetration by the at least one penetration element at least partially into or through an unperforated area near an edge of a relief plate precursor. In that manner the penetration elements are pushed in the material of the printing plate without generating waste. However, it is noted that the invention also covers the use of pre-perforated relief plate precursors which are coupled to the transport bar in the plate coupling station.

According to a preferred embodiment, a plate discharge zone is provided between an outlet side of the treatment compartment and the plate decoupling station such that a relief plate precursor is pulled fully out of the treatment compartment in the plate discharge zone before being decoupled from the transport bar in the plate decoupling station. Preferably, the transport system is configured to move the transport bar from the outlet side of the treatment compartment through the plate discharge zone to the plate decoupling station such that the relief plate precursor can be discharged in the plate discharge zone after being decoupled from the transport bar. In that manner, upon decoupling of the relief plate precursor, it can be released in the plate discharge zone.

According to a preferred embodiment, the apparatus further comprises a removal means configured to remove a treated relief plate precursor after being decoupled from the transport bar in the plate decoupling station. The removal means may comprise any one or more of the following: a carrier or a trolley configured for receiving the treated relief plate precursor in the plate discharge zone and for being moved out of the plate discharge zone; a robot; a moving belt; at least one rotating drum. For example, a trolley can be place underneath the plate discharge zone, so that the decoupled relief plate precursor can be easily transported to another machine for further treatment.

According to a preferred embodiment, the transport system comprises a forward transport mechanism configured to transport the transport bar with the coupled relief plate precursor at least from an inlet side to an outlet side of the treatment compartment, and from the outlet side to the plate decoupling station. Also, the transport system may comprise a bar coupling means configured to couple the transport bar with coupled relief plate precursor to the forward transport mechanism. The forward transport mechanism may comprise a first and a second forward transport mechanism extending at first and second opposite lateral sides of the treatment compartment, respectively. The first and second forward transport mechanism are configured to be coupled to a first and second end of the transport bar, respectively, and to transport the transport bar from the inlet side to the outlet side whilst the first and second end of the transport bar are moved along the first and second opposite side, respectively. The use of two forward transport mechanism has the advantage that the transport bar can be very stably transported through the treatment compartment. According to a preferred embodiment, the first and/or second forward transport mechanism comprises a first and/or second lead screw; and the first and/or second end of the transport bar is provided with a first and/or second coupling portion configured to be coupled to the first and/or second lead screw, respectively. For example, the first and second coupling portion may comprise teeth that fit into the grooves of lead screws The use of lead screws have the advantage of allowing a simple and robust coupling and decoupling to the ends of the transport bar.

According to another embodiment, the first and/or second forward transport mechanism comprises a first and/or second chain or belt or linear motor or combinations thereof; and the first and/or second end of the transport bar is provided with a first and/or second coupling portion configured to be coupled to the first and/or second chain or belt or linear motor, respectively.

According to a preferred embodiment, the transport system further comprises a backward transport mechanism configured to transport the transport bar from the plate decoupling station back to the plate coupling station. The backward transport mechanism may comprise any one of the following: one or more belts, one or more chains, one or more lead screws, a linear motor, or combinations thereof.

The backward transport mechanism may be located around the treatment compartment, preferably partly above or below the treatment compartment, and the transport system may comprise an additional transport mechanism, preferably an upward or downward transport mechanism such as a lifting mechanism configured to move a decoupled transport bar in the plate decoupling station upward or downward toward the backward transport mechanism. Alternatively the backward transport mechanism may be located at a lateral side of the treatment compartment, and the transport system may comprise a sideward transport mechanism, wherein optionally the transport bar is rotated from horizontal into a vertical position. The upward or downward or sideward transport mechanism may comprise any one or more of the following: magnetic means, electromagnetic means, clamping means, vacuum means, or combinations thereof.

Preferably the length of the forward transport mechanism is from 100 mm to 10000 mm, more preferably from 100 mm to 5000 mm. Further, the distance between the first and second forward transport mechanism may be from 100 mm to 10000 mm, more preferably from 1000 mm to 5000 mm.

Optionally there may be provided a detaching mechanism configure to detach the transport bar from the backward transport mechanism and deliver it to the plate coupling station. For example, the detaching means may comprise magnets and/or a lifting mechanism.

According to a preferred embodiment, the plate coupling station comprises at least one actuator connected to a hammer tool for pushing the at least one penetration element into the material of the relief plate precursor. The penetration elements may be pushed at least partially into the relief plate precursor or preferably through the material such that the penetration elements protrude out of the relief plate precursor. In a possible embodiment the hammer tool may be provided with openings in which the at least one penetration element can be received whilst the hammer tool pushes against the relief plate precursor which is supported on a support. Such a hammer tool allows a neat penetration of the material of the relief plate precursor.

According to a preferred embodiment, the plate coupling station comprises alignment means configured for aligning a relief plate precursor with respect to the transport bar. The alignment means may comprise movable elements which protrude through the transport bar in an alignment position and which are moved away from the transport bar in a rest position. In that manner, the relief plate precursor can be easily aligned above the at least one penetration element, before the hammer tool causes a penetration of the relief plate precursor.

According to a preferred embodiment, the plate decoupling station comprises at least one actuator connected to a tool configured for pushing the relief plate precursor away from the transport bar such that the at least one penetration element is moved out of the relief plate precursor. For example a piston, an actuator or a motor may be used.

According to a preferred embodiment, the apparatus further comprises a control unit configured to control the transport system, preferably such that at least two transport bars move simultaneously through the apparatus. Of course also other components of the apparatus may be controlled by the same control unit or by a different control unit, such as coupling and decoupling means. The control unit may be connected to any components (e.g. motors, gears, sensors, pumps, light sources, switches) of the apparatus in order to get information of their status and/or to control their actions. The status information may be visualized for an operator and may be stored electronically to be able to record and analyze the data. In addition the control unit may be able to accept orders from an operator and communicate these to the different components. An order might be given as a single order or a set of orders in a certain sequence and it may be generated and stored electronically. The control unit may comprise a computer or a PLC (programmable logic controller), a screen or other means for visualization, a speaker and/or a microphone or other means for acoustic signals and communication. The computer may be connected to converters which transfer the digital computer signals into analog or digital signals that may be read and understood by the components.

In one embodiment one transport bar may be transported through the treatment compartment, whereas at least one other transport bar is located at a different position. For example the at least one other transport bar may be at the coupling station, the decoupling station, the back transport mechanism or any other position. Preferably when one transport bar of the at least two transport bars moves through the treatment compartment, another one moves back to the plate coupling station. In that manner a following relief plate precursor can be coupled to a transport bar whilst a previous one is being treated. Further the speed of the transport may be controlled, such that the speed of the transport in the backward transport direction may be larger than the speed of the transport in the forward transport direction. In that manner the process time can be further reduced.

According to another embodiment, the apparatus further comprises a transport bar wherein the shape of the at least one penetration element is selected from a group comprising: a rod with e.g. a round, elliptical, triangular, rectangular or multi-angular cross section, a blade, a needle, or combinations thereof. Preferably, the penetration elements have sharp symmetrical or asymmetrical tips or edges.

According to a further embodiment, the apparatus further comprises a transport bar wherein each penetration element comprises a penetrating portion intended for penetrating substantially perpendicular into or through the relief plate precursor. There may be situations where penetrating portion may be inclined and preferably the inclination is towards the transport direction. In other words there is an angle of 60° to 90°, preferably 70 to 90°, more preferably 80 to 90° between the plate surface and the penetrating portion. Preferably, the penetrating portion has a length, seen in a penetration direction, between 1 mm and 20 mm, preferably between 2 and 15 mm.

The penetration elements can be made from any hard material which can penetrate into or through the plate precursor material. It can be made from metals or alloys, ceramics, polymers, glass, or combinations thereof. Preferably they are made from metals or alloys.

The transport bar to be used in the apparatus claimed has a length in the region of 100 mm to 10000 mm. preferably from 200 mm to 5000 mm, more preferably from 500 mm to 3000 mm.

According to a second aspect there is provided a method for treating a relief plate precursor, such as a printing plate precursor comprising the steps:

a) coupling a relief plate precursor to a transport bar in a plate coupling station of a treatment apparatus,
b) transporting the transport bar with the coupled relief plate precursor through a treatment zone of the treatment apparatus,
c) decoupling the transport bar from the treated relief plate precursor in a plate decoupling station of the treatment apparatus,
d) transporting the decoupled transport bar back to the plate coupling station;

wherein steps a)-d) are performed automatically and such that the transport bar is moved in a closed loop from the plate coupling station through the treatment zone to the plate decoupling station and back to the plate coupling station.

The advantages and considerations set out above for the apparatus apply mutatis mutandis for the method.

According to a preferred embodiment, at least two transport bars are being transported simultaneously in the treatment apparatus. Preferably, one of the at least two transport bars is being transported through the treatment zone whilst another one is being transported back to the coupling station. Also other arrangements are possible, e.g. one transport bar may be within the treatment zone whereas the at least one other transport bar may be at the decoupling station, within the back transport system, at the coupling station or somewhere in between. Further, the transport speed of step b) and d) may be different, wherein preferably the transport speed of step d) is faster than of step b). More preferably, the ratio of the speed of step d) divided by the speed of step b) is in the range from 1 to 400, preferably 1 to 350, even more preferably 2 to 300. The speed of step b) may be in the range 1 mm/min to 10000 mm/min, preferably in the range 5 mm/min to 2000 mm/min, more preferably in the range 10 mm/min to 1000 mm/min. The speed of step d) may be in the range 1 mm/sec to 10000 mm/sec, preferably in the range 5 mm/sec to 5000 mm/sec, more preferably in the range 10 mm/sec to 2000 mm/sec. Such speeds and speed ratio's allow to further optimize the process and increase the speed thereof. For example the speed in step b) may be increased once the trailing edge of the relief precursor left the treatment zone. This is preferably done when precursors are treated, which do not have the full length of the decoupling station.

According to a preferred embodiment, the treatment in the treatment compartment is selected from the group comprising washing, brushing, rinsing, spraying, drying, irradiating, developing, heating, cooling, removing of material, treating with gases or liquids, sanding, cutting, treating with electromagnetic waves, and combinations thereof.

According to a possible embodiment, wherein the treatment in the treatment zone is a heat treatment resulting in a liquefied part of relief plate precursor followed by contacting the liquefied part with a moving acceptor material, such as a web, a non woven material, or a foil to which molten material adheres, and continuously removing the liquefied part with the acceptor material. For heating the relief precursor any method known to a person skilled in the art can be used e.g. heated rolls, hot gas or liquid, IR radiation and combinations thereof. The acceptor material may be a glass, a ceramic, a natural or artificial polymer or a combination thereof.

According to an exemplary embodiment, the method further comprises the step of performing a post-treatment on the relief plate precursor, said post-treatment being selected from the group comprising washing, brushing, rinsing, spraying, drying, irradiating, developing, heating, cooling, removing of material, treating with gases or liquids, sanding, cutting, treating with electromagnetic waves and combinations thereof.

According to an exemplary embodiment, the method further comprises the step of performing a pre-treatment on the relief plate precursor, said pre-treatment being selected from the group comprising: cutting, ablation, exposure to electromagnetic radiation, and combinations thereof.

According to a third aspect there is provided an apparatus for treating a relief plate precursor, such as a printing plate precursor, preferably with a liquid, comprising a treatment compartment configured for treating a relief plate precursor, preferably with a liquid, whilst the relief plate precursor is being transported coupled to a transport bar; a plate decoupling station configured for decoupling the treated relief plate precursor from the transport bar; a plate discharge compartment between an outlet side of the treatment compartment and the plate decoupling station; said plate discharge compartment being configured to allow a relief plate precursor which is moved out of the treatment compartment to fall downward when the relief plate precursor is being decoupled from the transport bar in the decoupling station.

Such an arrangement allows for a fast and easy decoupling of the relief plate precursor, wherein the relief plate precursor can automatically fall into the plate discharge compartment from where it can be removed.

According to a preferred embodiment, the apparatus further comprises a removal means configured to remove a treated relief plate precursor after being decoupled from the transport bar in the plate decoupling station. The removal means may comprise any one or more of the following: a carrier or a trolley configured for receiving the treated relief plate precursors in the plate discharge zone and for being moved out of the plate discharge zone; a robot; a moving belt; at least one rotating drum, or combinations thereof.

Preferably, the apparatus of the third aspect further comprises a transport system configured to move the transport bar, after being coupled to a relief plate precursor, through the treatment station to the plate decoupling station. The transport system may be configured to move the transport bar from the outlet side of the treatment compartment through the plate discharge compartment to the plate decoupling station such that the relief plate precursor can be discharged in the plate discharge compartment after being decoupled from the transport bar.

According to a preferred embodiment, the apparatus further comprises a plate coupling station configured for coupling a relief plate precursor to be treated to the transport bar; wherein the transport system is configured to move the transport bar, after being coupled to a relief plate precursor in the plate coupling station, from the plate coupling station through the treatment station to the plate decoupling station, and, after being decoupled from a treated relief plate precursor, from the plate decoupling station back to the plate coupling station.

With respect to the coupling station, the transport mechanisms, the decoupling station, the transport bar and the penetration elements attached to the transport bar the descriptions made above are valid.

According to a fourth aspect there is provided a method for treating a relief plate precursor, such as a printing plate precursor, preferably with a liquid, comprising: treating a relief plate precursor in a treatment zone, preferably with a liquid, whilst the relief plate precursor is being transported coupled to a transport bar; moving the transport bar with coupled relief plate precursor out of the treatment zone into a plate discharge zone; decoupling the treated relief plate precursor in the plate discharge zone from the transport bar whilst allowing the relief plate precursor to fall downward in a plate collection zone. The plate collection zone may be at the same time a plate removal means such as a trolley or a carrier.

According to a fifth aspect there is provided an apparatus for preparing a relief plate precursor, such as a printing plate precursor (P) that has to be treated. The apparatus comprises a transport bar provided with at least one penetration element, preferably a plurality of penetration elements, more preferably at least one penetration element with a sharp tip or edge; a plate coupling station configured for coupling a relief plate precursor to the transport bar by causing a penetration by the at least one penetration element through an unperforated area near an edge of a relief plate precursor.

Such an arrangement has the advantage that a relief plate precursor can be coupled to the transport bar without causing waste material to be generated whilst at the same time allowing a good coupling.

Preferably, the plate coupling station comprises at least one actuator connected to a hammer tool for pushing the at least one penetration element (preferably consisting of a plurality of penetration elements) through the material of the relief plate precursor. Also, the plate coupling station may comprise an alignment means configured for aligning a relief plate precursor with respect to the transport bar. Advantages and preferred embodiments thereof may be as disclosed in connection with the first aspect.

Preferably, the length of the transport bar is from 100 mm to 10000 mm, more preferably between 1000 and 5000 mm.

According to a preferred embodiment, the shape of the at least one penetration element is selected from a group comprising: a rod, a blade, a needle, or combinations thereof.

According to a preferred embodiment, each penetration element comprises a penetration portion having a length, seen in a penetration direction, between 1 mm and 20 mm. Preferably, the penetration portion has a maximum dimension, seen in a direction perpendicular on the penetration direction, which is smaller than 5 mm, more preferably smaller than 3 mm. For example, when the penetration portion has a round cross section, the diameter is preferably smaller than 5 mm, more preferably smaller than 3 mm.

According to a preferred embodiment, the length of the transport bar is from 100 mm to 10000 mm.

According to a sixth aspect there is provided a method for transporting a relief plate precursor (P), preferably with a liquid, comprising: providing a transport bar with at least one penetration element, preferably a plurality of penetration elements, more preferably at least one penetration element with a sharp tip or edge; and causing a penetration by the at least one penetration element through an unperforated area near an edge of a relief plate precursor so that the relief plate precursor is coupled to the transport bar.

Preferably, the method further comprises: moving the transport bar with coupled relief plate precursor through a treatment zone of a treatment apparatus, and decoupling the transport bar from the treated relief plate precursor in a plate decoupling station of the treatment apparatus. Preferably, the coupling is done is a plate coupling station, and the transport bar is moved in a closed loop from the plate coupling station through the treatment zone to the plate decoupling station and back to the plate coupling station. Two, three or more transport bars may be transported simultaneously in the treatment apparatus. For example, one of the at least two transport bars may be transported through the treatment zone whilst another one is being transported back to the coupling station, as has been explained in more detail above.

Where possible, preferred features of one of the aspects may be added to other aspects.

BRIEF DESCRIPTION OF THE FIGURES

The accompanying drawings are used to illustrate presently preferred non limiting exemplary embodiments of the apparatus and method of the present invention. The above and other advantages of the features and objects of the invention will become more apparent and the invention will be better understood from the following detailed description when read in conjunction with the accompanying drawings, in which:

FIGS. 4A and 4B illustrate the arrangement of FIG. 3 whilst moving a hammer tool downward in the direction of the relief plate precursor, wherein FIG. 4B illustrates the situation where the plurality of penetration elements of the transport bar extend through an area near an edge of the relief plate precursor;

DETAILED DESCRIPTION OF EMBODIMENTS

Figure 1:
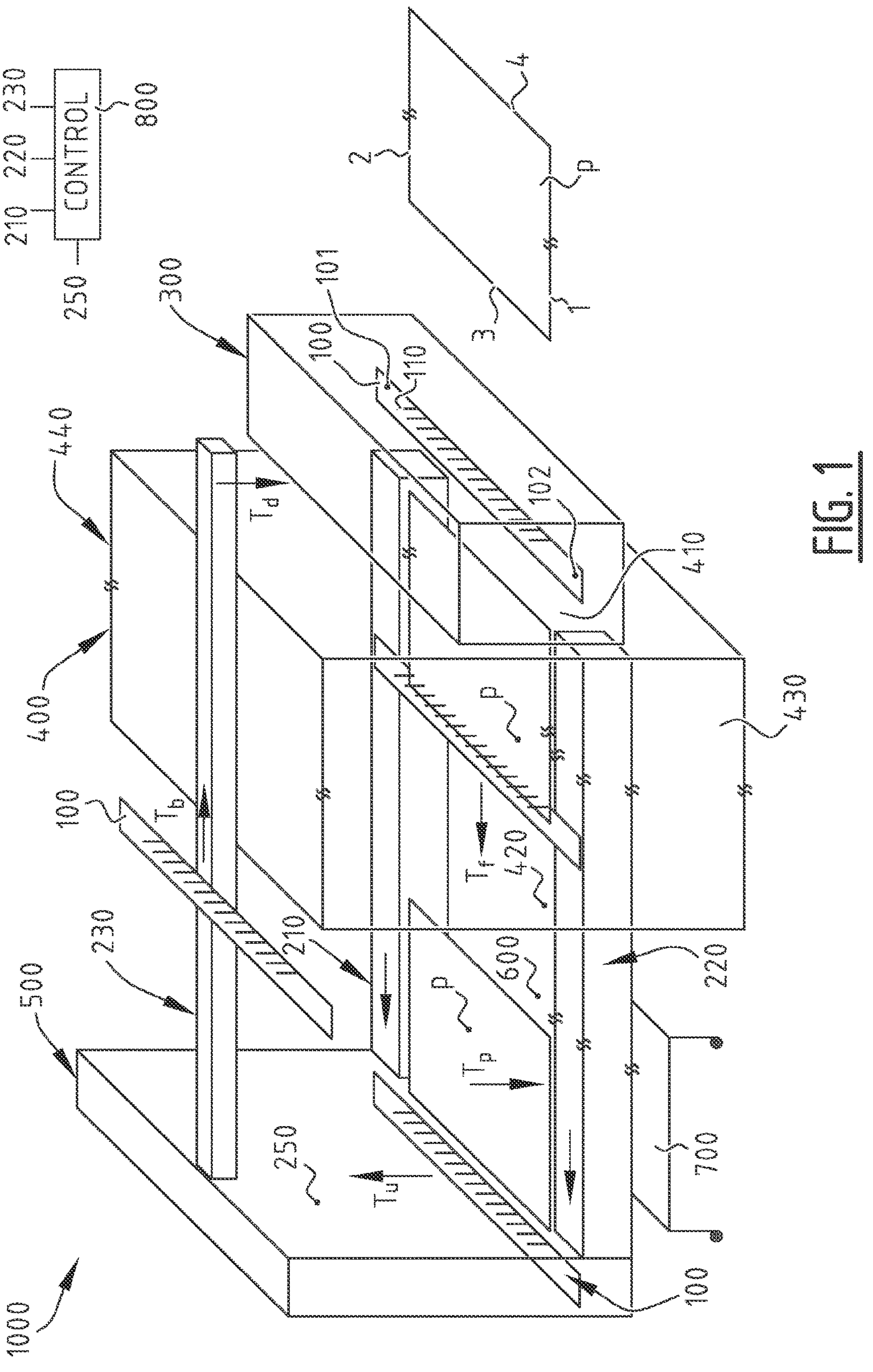
FIG. 1 is a schematic perspective view of an exemplary embodiment of an apparatus for treating a relief plate precursor.

FIG. 1 illustrates schematically an apparatus 1000 for treating a relief plate precursor, such as a printing plate precursor P. The apparatus is for instance a washing apparatus for washing a relief plate precursor with a liquid. However, also other treatments are possible such as brushing, rinsing, spraying, drying, irradiating, developing, heating, cooling, removing of material of the relief plate precursor, treating the relief plate precursor with gases or liquids, sanding the relief plate precursor, cutting the relief plate precursor, treating it with electromagnetic waves, or combinations thereof.

The apparatus 1000 comprises a transport system 210, 220, 230 with at least one, preferably at least two, and even more preferably at least three transport bars 100 intended to be coupled to a relief plate precursor. For example, four transport bars 100 may be provided to the transport system 210, 220, 230 as illustrated in FIG. 1. The transport bar 100 is coupled to a leading edge 3 of the relief plate precursor P and preferably extends over more than the entire length of the leading edge 3, such that end parts of the transport bar 100 can be coupled to a transport mechanism, see further. It is noted that it is also possible to couple a plurality of relief plate precursors to the transport bar 100. Preferably, the length of the transport bar 100 is between 100 mm and 1000 mm, more preferably between 1000 mm and 4000 mm.

The apparatus 1000 comprises a plate coupling station 300 configured for coupling a relief plate precursor P to a transport bar 100, a treatment compartment 400 configured for treating the relief plate precursor whilst the transport bar 100 to which the relief plate precursor P is coupled, is moved through the treatment compartment 400, and a plate decoupling station 500 configured for decoupling the treated relief plate precursor P from the transport bar 100. The transport system 210, 220, 230 is configured to automatically move each transport bar 100, after being coupled to a relief plate precursor P in the plate coupling station 300, from the plate coupling station 300 through the treatment station 400 to the plate decoupling station 500, and, after being decoupled from a treated relief plate precursor P, from the plate decoupling station 500 back to the plate coupling station 300, such that the transport bar 100 moves in a closed loop through the apparatus 1000. In the illustrated example of FIG. 1, four transport bars 100 circulate in the apparatus 1000.

Figures 2, 2A:
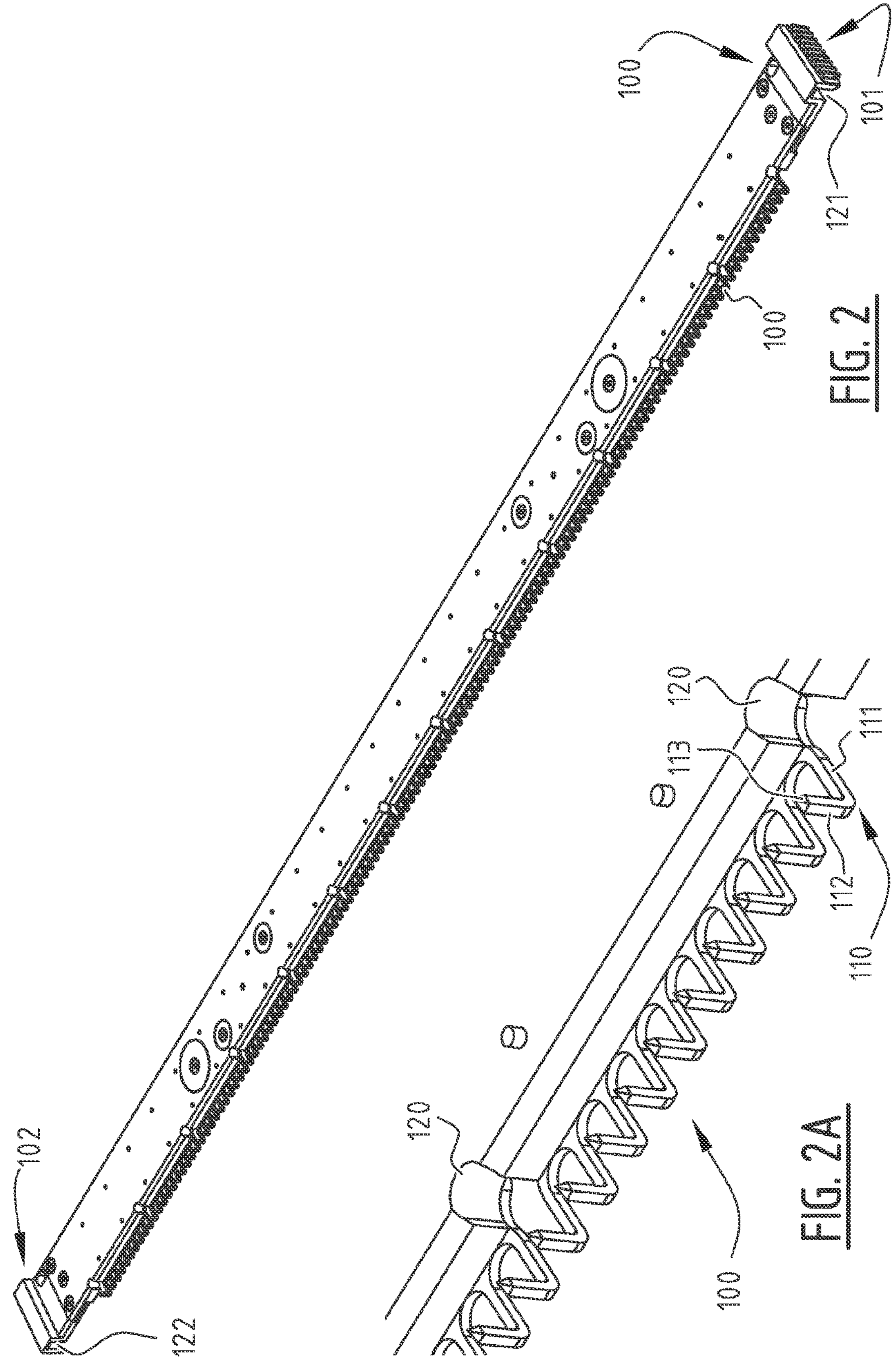
FIG. 2 is a schematic perspective view of an exemplary embodiment of a transport bar.
FIG. 2A is a detailed perspective view of a portion of the transport bar of FIG. 2.

In a preferred embodiment, each transport bar 100 is provided with a plurality of penetration elements 110 (here in the form of pins or rods), and the plate coupling station 300 is configured to engage the plurality of penetration elements 110 in an area near the leading edge 3 of the relief plate precursor P. In FIG. 1, the relief plate precursor P has a leading edge 3, a trailing edge 4, both perpendicular to a forward transport direction Tf of the relief plate precursor P through the apparatus 1000, and two side edges 1, 2 parallel to the forward transport direction Tf. An area near the leading edge 3 of the relief plate precursor P is coupled to the plurality of penetration elements 110 of the transport bar 100. FIGS. 2 and 2A illustrate a more detailed exemplary embodiment of a transport bar 100. As is best visible in FIG. 2A, the plurality of penetration elements 100 preferably have sharp tips 113, and the plate coupling station 300 is preferably configured to cause a penetration of the plurality of penetration elements 110 at least partially into or through an unperforated area near the leading edge 3 of the relief plate precursor P. However, it is noted that according to another exemplary embodiment, the apparatus 1000 of FIG. 1 may also be used with transport bars 100 which are provided with a plurality of penetration elements 110 which do not have a sharp tip. For example, the area near the leading edge 3 of the relief plate precursor P may be pre-perforated before bringing the relief plate precursor P to the plate coupling station 300, such that the plurality of penetration elements 110 can be arranged through pre-perforated holes in the area near the leading edge 3.

The treatment compartment 400 has an inlet side 410 and an outlet side 420. A transport bar 100 with a coupled relief plate precursor P is moved through the treatment compartment 400 from the inlet side 410 to the outlet side 420, wherein the transport bar 100 moves in the forward transport direction Tf. Between the outlet side 420 of the treatment compartment 400 and the plate decoupling station 500, there is provided a plate discharge zone 600. A relief plate precursor P is pulled by the transport system fully out of the treatment compartment 400 in the plate discharge zone 600 before being decoupled from the transport bar 100 in the decoupling station 500. In that way, when the relief plate precursor P is decoupled from the transport bar 100, the relief plate precursor P can be discharged in the plate discharge zone 600. At the bottom of the plate discharge zone 600 there may be provided a removal means configured to remove a treated relief plate precursor P after being decoupled from the transport bar 100 in the plate decoupling station 500. In the illustrated embodiment, the removal means 700 is a trolley configured for receiving the treated relief plate precursor P in the plate discharge zone 600, and for being moved out of the plate discharge zone 600, such that it can be easily transported away of the plate discharge zone. For example, if the apparatus 1000 is a washer, an operator may transport the washed relief plate precursor P to a dryer in order to dry the washed relief plate precursor. In other non illustrated embodiments, the removal means 700 may be a carrier, a robot, a moving belt, at least one rotating drum, etc. Also such devices can be configured to move a treated relief plate precursor P out of the plate discharge zone 600 after being decoupled in the plate decoupling station 500.

In the embodiment of FIG. 1, the transport system comprises a forward transport mechanism which comprises first mechanism 210 on one side of the apparatus 1000, and a second transport mechanism 220 on the other side of the apparatus 1000. The transport mechanism 210, 220 is configured to transport the transport bar 100 with a coupled relief plate precursor P at least from the inlet side 410 to the outlet side 420 of the treatment compartment 400, and from the outlet side 420 to the plate decoupling station 500, in the forward transport direction Tf. To that end, a first end 101 of the transport bar 100 is coupled with the first forward transport mechanism 210, and a second end 102 of the transport bar 100 is coupled with the second forward transport mechanism 220. As illustrated for an exemplary embodiment in FIG. 9, the transport system may comprise a bar coupling means 215 configured to couple the transport bar, and more in particular end 101 and the second end 102 of the transport bar to the first and second forward transport mechanism 210, 220. The bar coupling means 215 may e.g. be configured for pushing or moving the transport bar 100 in the direction of the first and second forward transport mechanism, in order to cause a coupling of the end parts 101 and 102 of the transport bar 100 to the forward transport mechanism 210, 220. In the embodiment of FIG. 1, the treatment compartment 400 has a first and second opposite lateral side 430, 440 extending in the forward transport direction Tf, and the first and second forward transport mechanism 210, 220 extend at the first and second opposite lateral side 430, 440 of the treatment compartment 400, respectively.

Figures 8, 9:
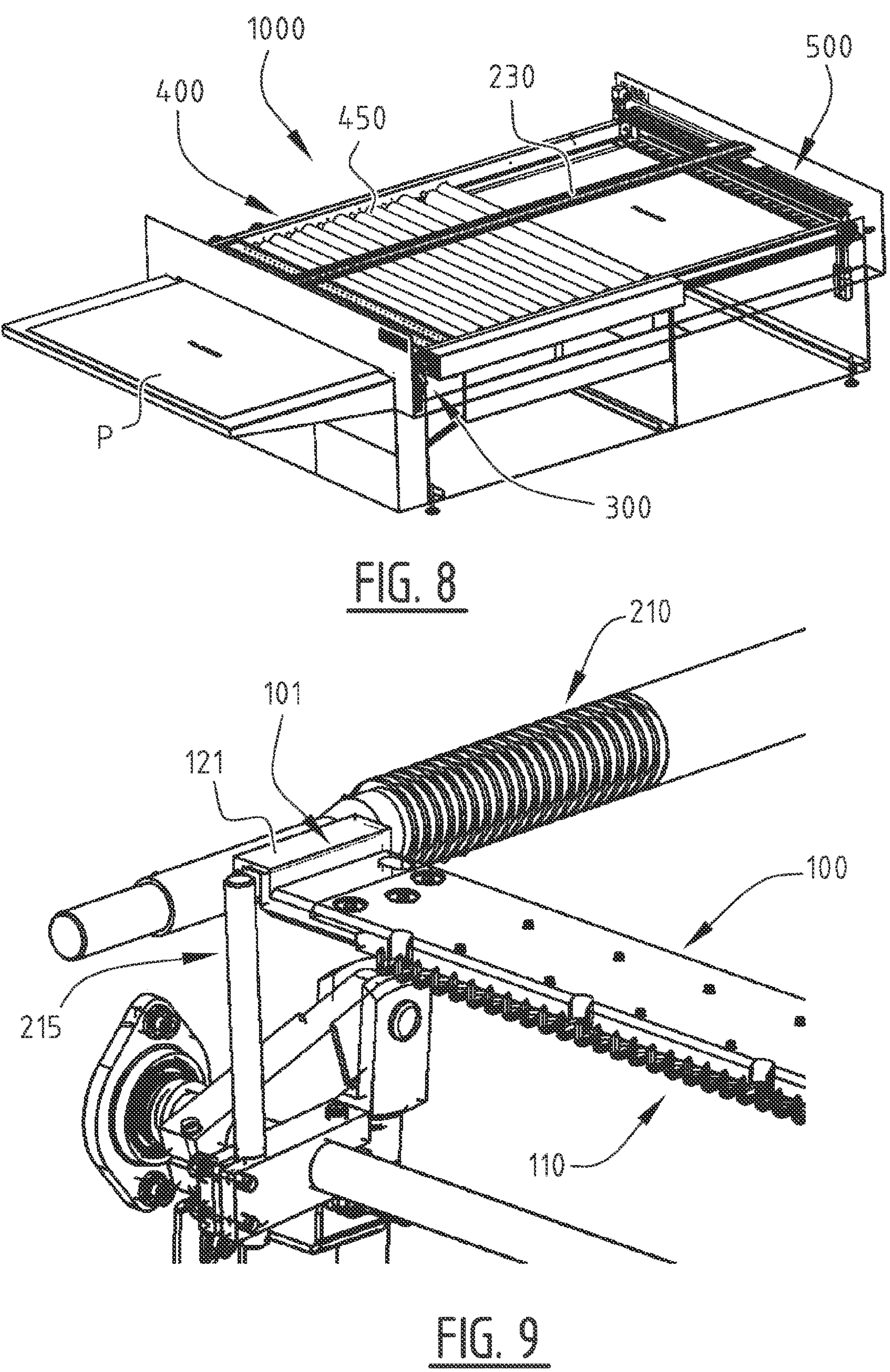
FIG. 8 illustrates a schematic perspective view of an exemplary embodiment of an apparatus for treating a relief plate precursor.
FIG. 9 is a detailed perspective view illustrating a portion of the plate coupling station of the embodiment of FIG. 8.

As illustrated in FIG. 9, in an exemplary embodiment, the first forward transport mechanism 210 comprises a first lead screw, and the first end 101 of the transport bar 100 is provided with a first coupling portion 121 configured to be coupled to the first lead screw 210. In a similar manner, the second forward transport mechanism 220 may be provided with a second lead screw, which can be coupled to a second coupling portion 122. These first and second coupling portions 121, 122 are also illustrated in FIG. 2. However, in other embodiments, the first and/or second forward transport mechanism 210, 220 may comprise other transport means such as a chain or belt, and the first and second coupling portions 121, 122 may be adapted accordingly.

The transport system further comprises a backward transport mechanism 230 configured to transport the transport bar 100 from the plate decoupling station 500 back to the plate coupling station 300. In the illustrated embodiment of FIG. 1, the backward transport mechanism 230 is located at an upper side of the apparatus 1000. However, in other embodiments, the backward transport mechanism 230 could be arranged in a lower portion of the apparatus 1000, below the forward transport mechanism 210, 220. A backward transport mechanism 230 may comprise any one of the following: one or more belts, one or more chains, one or more lead screws, a linear motor, or combinations thereof.

In FIG. 1, the backward transport mechanism 230 is arranged centrally above the treatment compartment 400. However, the backward transport mechanism 230 could also be realized with a first and second backward transport mechanism located at opposite lateral sides of the treatment compartment 400 above or below the first and second forward transport mechanism 210, 220. Alternatively, the backward transport mechanism may be located at a lateral side of the treatment compartment, and optionally the transport bar may be rotated and transported backward in a vertical position. However, in order to reduce the footprint of the apparatus the backward transport mechanism is preferably located above or below the first and second forward transport mechanism 210, 220.

As illustrated in FIG. 1, the backward transport mechanism 230 is located partly above the treatment compartment 400, and the transport system further comprises an upward transport mechanism 250 configured to move a decoupled transport bar 100 in the plate decoupling station 500 upward towards the backward transport mechanism 230. For example, the upward transport mechanism 250 may move the transport bar 100 in an upward direction Tu, typically a vertical direction, towards the backward transport mechanism 230 which moves the transport bar 100 in a backward transport direction Tb opposite to the forward transport direction Tf, back to the plate coupling station 300. The upward transport mechanism 250 may comprise any one or more of the following: magnetic means, electromagnetic means, clamping means, vacuum means, linear motors, chains, belts, lead screws, piston or combinations thereof. In other embodiments where the backward transport mechanism 230 is located below the forward transport mechanism, there may be provided a downward transport mechanism. The downward transport mechanism may comprise any one or more of the following: magnetic means, electromagnetic means, clamping means, vacuum means, linear motors, chains, belts, lead screws, piston or combinations thereof, or occur simply by gravity.

FIGS. 2 and 2A illustrate a more detailed exemplary embodiment of a transport bar 100. The transport bar 100 is provided with a first coupling portion 121 and a second coupling portion 122 at the first end 101 and the second end 102. In this case the coupling portion 121 is configured with coupling means to be used in combination with a lead screw. FIG. 2A shows a close-up of the transport bar 100 with penetration elements 110. Each penetration element 110 has a connecting portion 111, a penetration portion 112 and a tip 113. It is worth noting that in this case the penetration portions 112 have a rectangular cross-section and an asymmetrical tip 113. Preferably, the penetration portion 112 has a maximum dimension, seen in a cross section perpendicular on the penetration direction, which is smaller than 5 mm, more preferably smaller than 3 mm. In other words, in the illustrated example of a rectangular cross section, the longest sides of the rectangle are preferably smaller than 5 mm, more preferably smaller than 3 mm. The transport bar 100 is equipped with channels 120 allowing pins to pass through the transport bar 100 from below the transport bar, see also FIGS. 3 and 3A discussed below.

Figures 3, 3A:
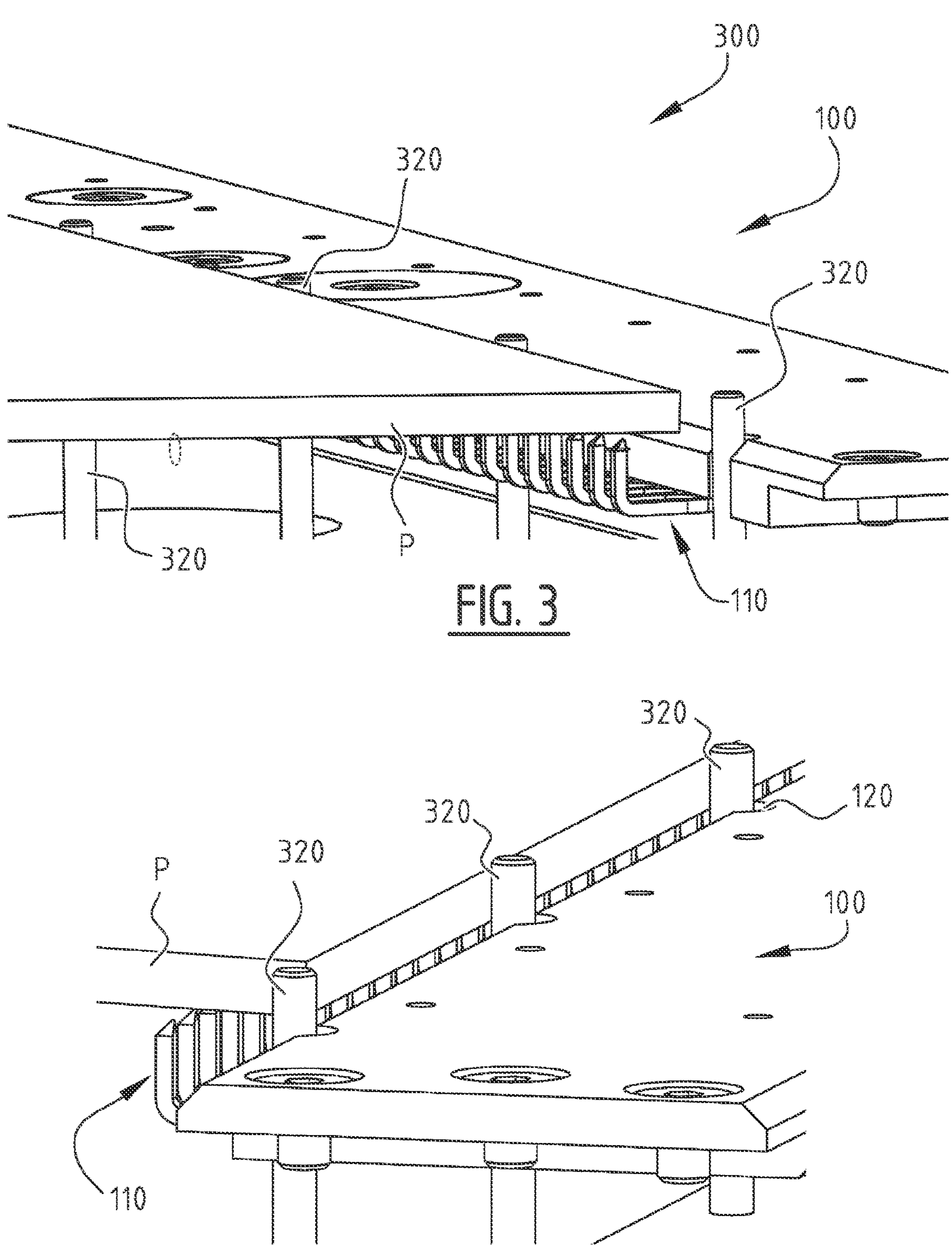
FIG. 3 is a schematic perspective view illustrating a relief plate precursor aligned with the transport bar of FIG. 2.
FIG. 3A is a detailed view seen from another side of the arrangement of FIG. 3.
Figure 4A:
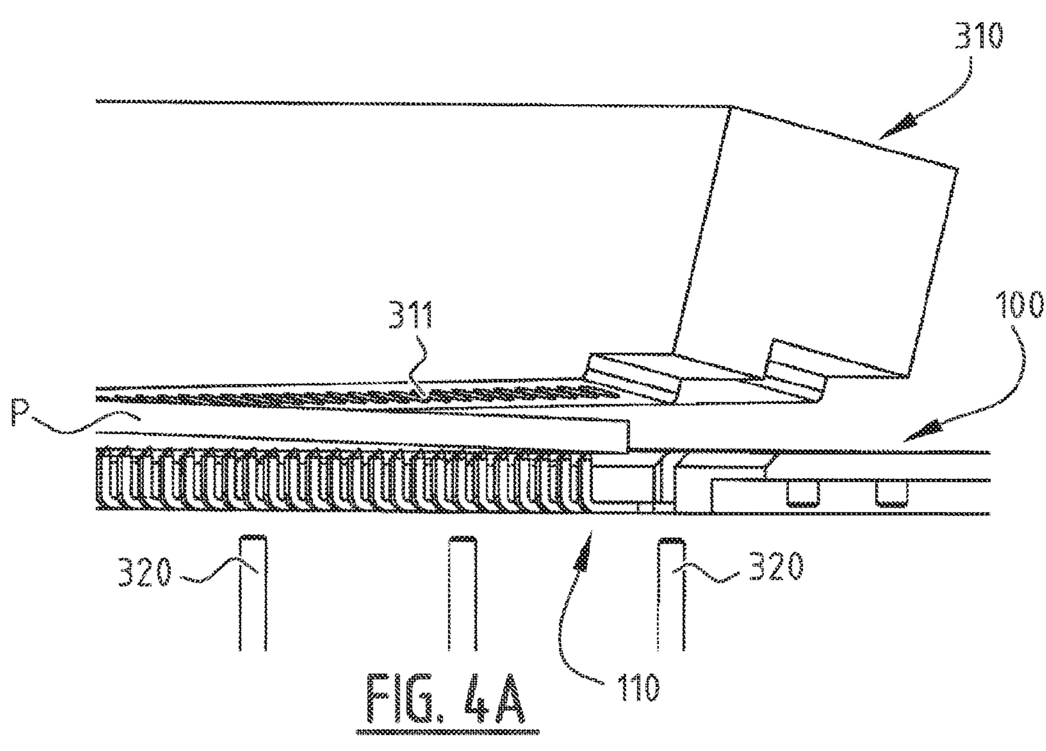
Figure 4B:
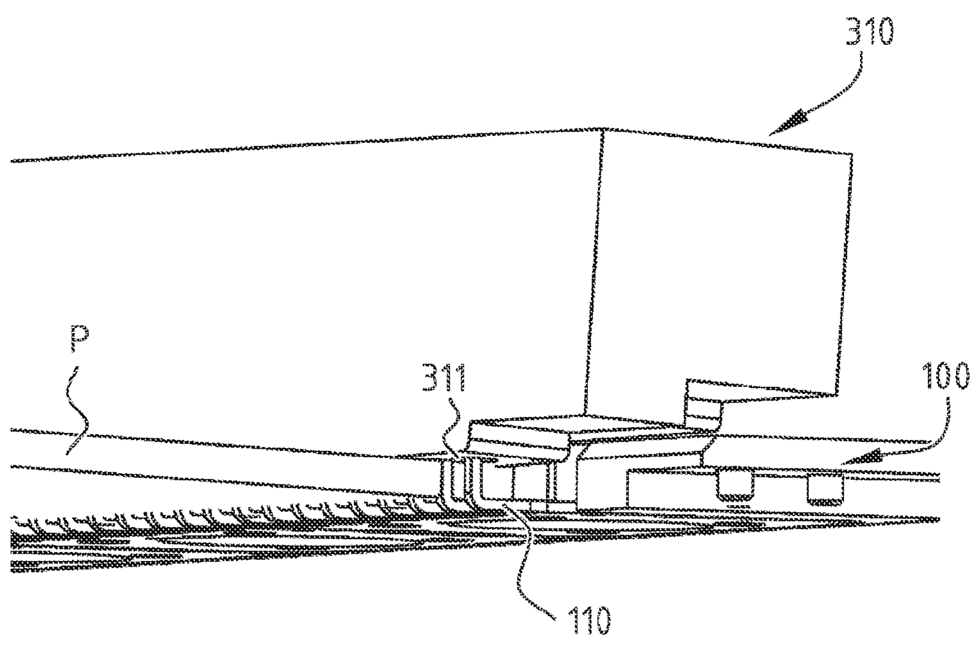
Figure 4C:
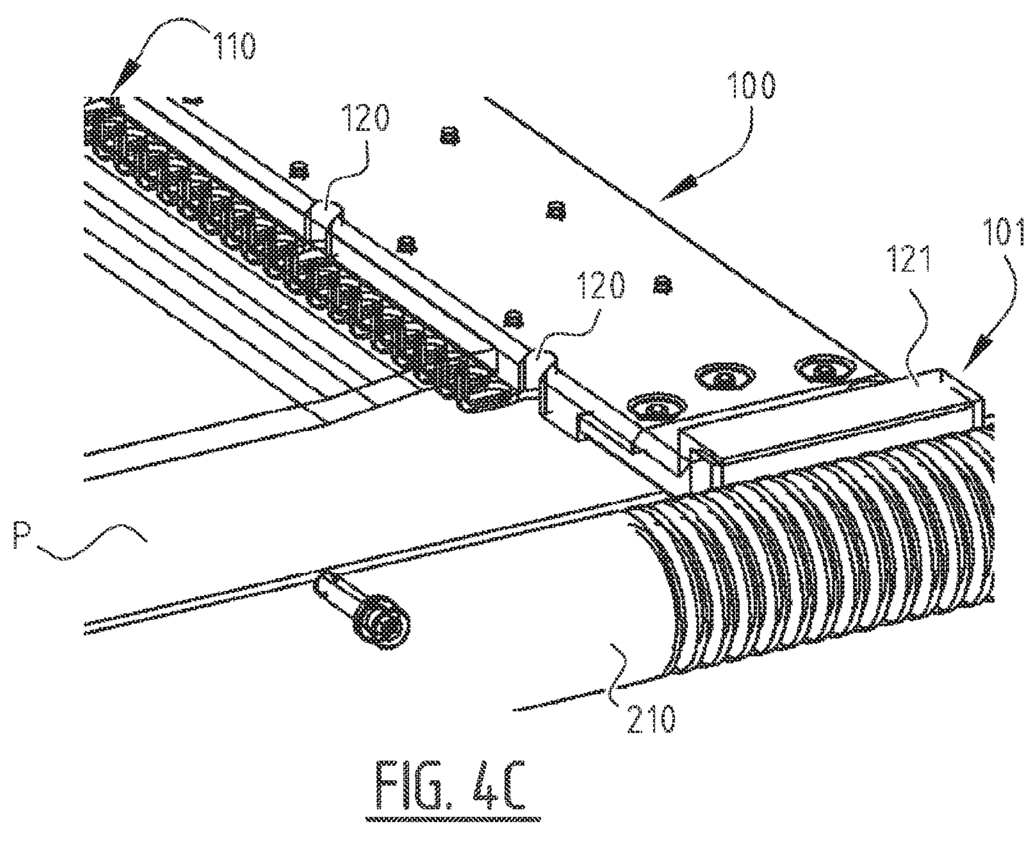
FIG. 4C illustrates the arrangement of FIG. 4B after the hammer tool has been removed.

Now a detailed description of an exemplary embodiment of the plate coupling station 300 and the steps taking place in the plate coupling station 300 will be described with reference to FIGS. 3, 3A, 4, and 4A-4C. FIGS. 3 and 3A illustrate a transport bar 100 in the coupling station 300. The plate coupling station 300 comprises alignment means, here in the form of moveable pins 320, configured for aligning a relief plate precursor P with respect to the transport bar 100. The movable pins 320 extend adjacent the transport bar 100. To that end, the transport bar 100 is provided with channels 120 allowing the pins to pass through the transport bar 100 from below the transport bar 100 to a position in which they protrude through the transport bar 100, as is best visible in FIG. 3A. After having aligned the relief plate precursor P against the alignment pins 320, the alignment pins 320 are moved downward and a hammer tool 310 pushes the plurality of penetration elements 110 through the material of the relief plate precursor, see FIGS. 4A and 4B. In a preferred embodiment, the hammer tool 310 comprises a plurality of holes 311 configured for receiving the plurality of penetration elements 110. However, other hammer tools 310 are possible and the skilled person understands that it would also be possible to provide e.g. one elongated recess configured for receiving the plurality of penetration elements 110, instead of a series of holes 311.

Figure 5:
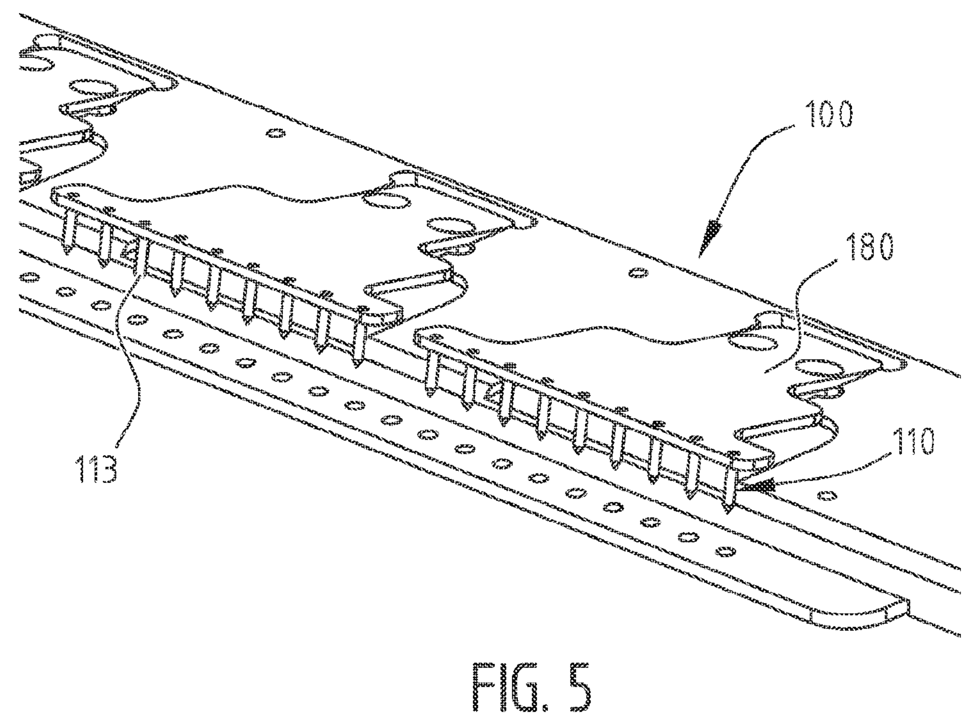
FIG. 5 illustrates a variant of the transport bar of FIG. 2.

FIG. 5 illustrates another exemplary embodiment of a transport bar 100 which is provided with a plurality of penetration elements 110 attached to one or several movable plates 180 which are pushed downward by a hammer tool (not shown) to push the plurality of penetration elements 110 at least partially into the material of the printing plate precursor. The length of the penetration elements 110 may be such that tips 113 of the penetration elements 110 end up in the holes of a plate underneath the precursor after penetrating the relief precursor. In such an embodiment the hammer tool may have a flat lower surface. Further there may be provided an actuator to move the one or more movable plates 180 upward for receiving a relief plate precursor, whereupon the hammer tool is activated. Instead of having a movable plate 180 for a plurality of penetration elements 110, there may be provided a pivotable arm for each penetration element, wherein the hammer tool is then pushed against the pivotable arms.

Figure 6A:
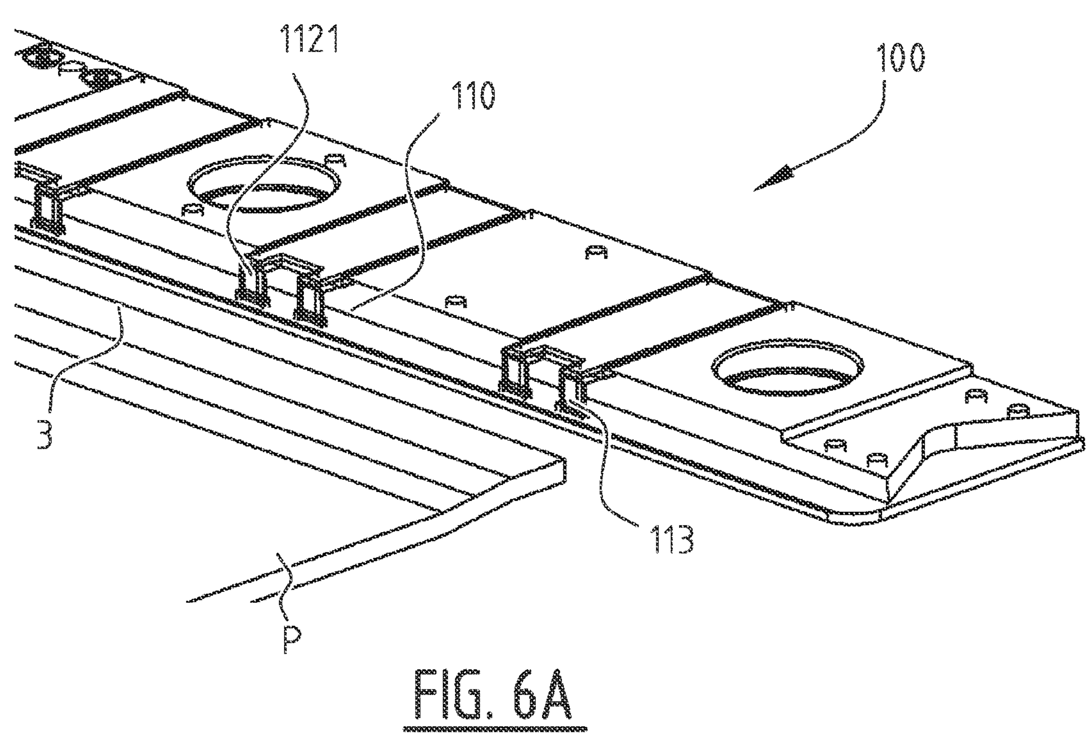
FIGS. 6A and 6B illustrate another exemplary embodiment of a transport bar before and after coupling a relief plate precursor to the transport bar, respectively.
Figure 6B:
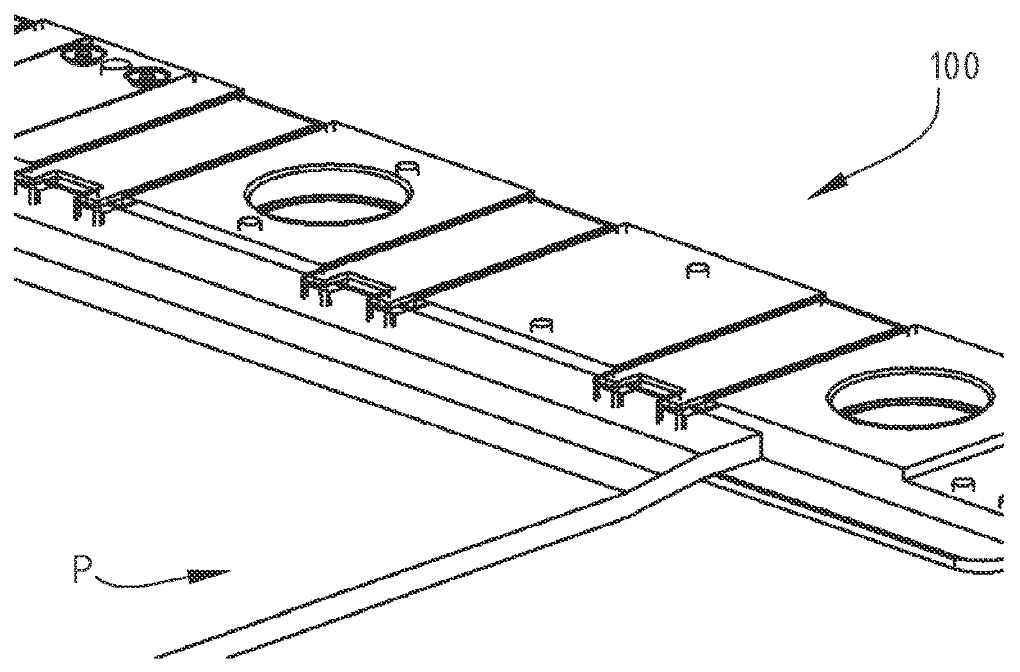

FIGS. 6A and 6B illustrate yet another embodiment of a transport bar 100 provided with a plurality of penetration elements 110 which are configured to penetrate an unperforated area near a leading edge 3 of the relief plate precursor P. In this embodiment, the penetration elements 110 have a sharp knife edge 130 capable of being pushed by a hammer tool through the material of the relief plate precursor. In such an embodiment, the hammer tool pushes the penetration elements 110 downward in the material of the relief plate precursor P. The penetration action caused by the plurality of penetration elements 110 generates a hole in the material of the relief plate precursor, preferably without removing material.

It is noted that the shape of the penetration elements 110 may vary and the shape may be e.g. any one of the following: a tube, a blade, a needle, or a combinations thereof. Preferably, each penetration element 110 comprises a penetration portion 112 (see FIGS. 2A and 6A) intended for extending substantially perpendicular through the relief plate precursor, wherein the penetration portion 112 has a length between 1 mm and 20 mm. In yet other embodiments, instead of providing the transport bar with a plurality of penetration elements, the transport bar could be provided with one or more elongated blade elements having a sharp edge.

Figure 7A:
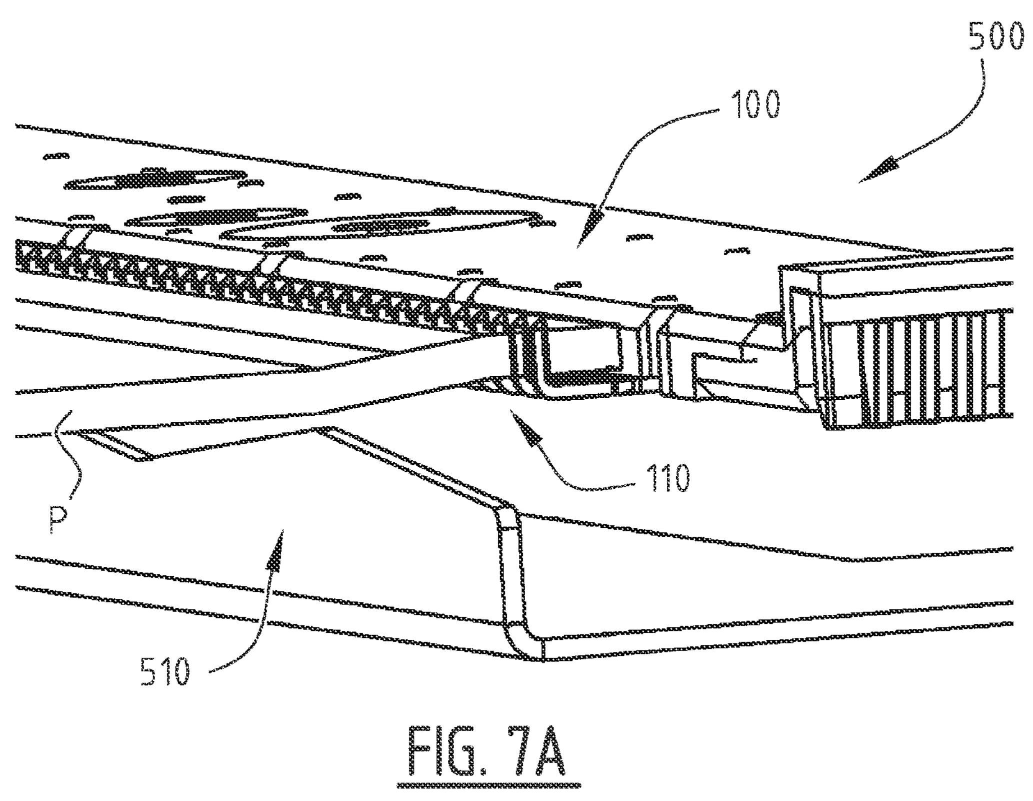
FIGS. 7A and 7B illustrate an exemplary embodiment of a decoupling station showing the relief plate precursor before and after decoupling from the transport bar, respectively.
Figure 7B:
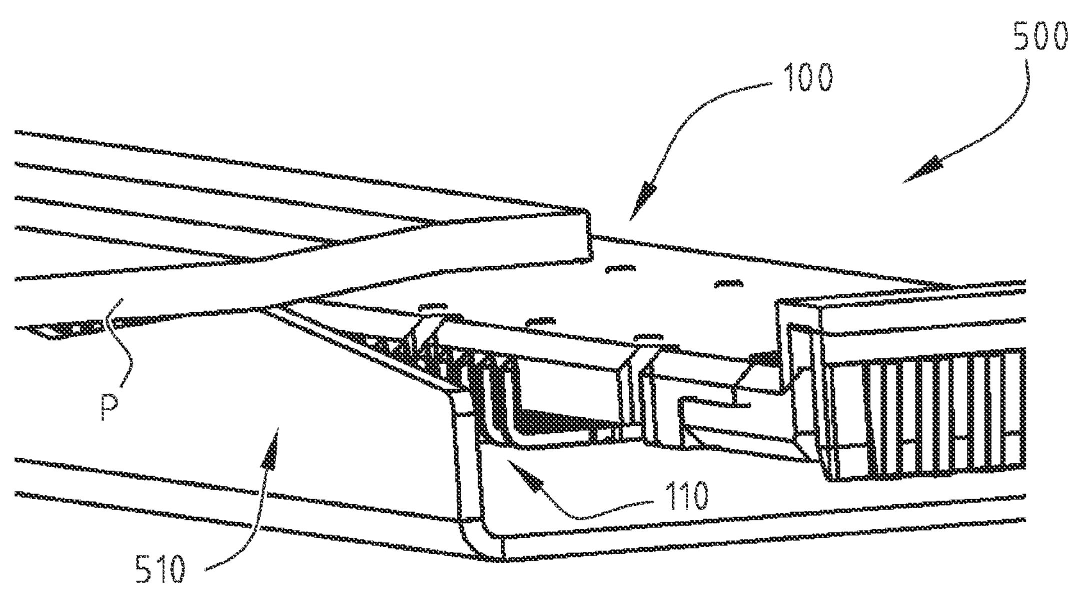

FIGS. 7A and 7B illustrate schematically the plate decoupling station 500 and the steps performed in the plate decoupling station 500. In FIG. 7A, the relief plate precursor P is still coupled to the transport bar 100. A decoupling tool 510 present below the relief plate precursor P is moved upward whilst the transport bar 100 is kept in position, such that the relief plate precursor P is removed from the plurality of penetration elements 110. After the removal of the relief plate precursor P from the plurality of penetration elements 110, the relief plate precursor P can fall in the plate discharge zone 600 and can be removed from the apparatus 1000, as has been illustrated above with reference to FIG. 1. The decoupling tool 510 may be a simple linear rod or bar or a bar with a corrugated or tooth like structure. Preferably a corrugated or tooth like structure is used to ease decoupling.

As illustrated in FIG. 1, the apparatus 1000 preferably comprises a control unit 800 configured to control different components of the apparatus, such as the transport mechanisms 210, 220, 230, 250 such that when one transport bar 100 of the plurality of transport bars moves through the treatment compartment 400, another transport bar 100 moves back to the plate coupling station 300. More preferably, at least three transport bars move in the system. In FIG. 1, the apparatus 1000 is illustrated with four transport bars which are controlled such that there may be simultaneously one transport bar in the plate coupling station 300, one transport bar in the treatment compartment 400, one transport bar in the plate decoupling station 500, and one transport bar being transported backward by the backward transport mechanism 230. Preferably, one of the at least two transport bars is being transported through the treatment zone whilst another one is being transported back to the coupling station. Further, the transport speed in the forward transport direction Tf may be different from the transport speed in the backward transport direction Tb, wherein preferably the transport speed in the backward transport direction Tb is faster than in the forward transport direction Tf. For example, the ratio of the transport speed in the backward transport direction divided by the speed in the forward transport direction may be in the range from 1 to 400, preferably 2 to 300. Typically, the forward and backward transport speed is in the range from 1 mm/sec to 1000 mm/sec.

FIG. 8 illustrates a further developed exemplary embodiment of an apparatus 1000. The treatment compartment 400 comprises a plurality of rotating brushes 450. The relief plate precursor P is pulled below the brushes 450 in order to be cleaned. The brushes may be arranged in a way that they are above the relief plate precursor P. Further nozzles and liquid injection means (not shown) may be provided to wash the relief plate precursor whilst the brushes 450 rotate over the relief plate precursor. In the illustrated embodiment, the brushes 450 have a rotating axis arranged perpendicular on the moving direction of the relief plate precursor P. However, in other embodiments, there may be provided a large number of rotating brushes mounted around a vertical rotation axis which are at least partially immersed in a liquid bath. The rotating brushes 450 or any alternative brushes are arranged for thoroughly cleaning the relief plate precursor. The rotation direction of the brushes may be the same than the transport direction or opposite, preferably some rotate in the transport direction and some opposite to the transport direction. Additionally the brushes may be moved in a direction parallel to their axis (oscillating). The speed of the brushes may be varied over a broad range of speeds, e.g. in the range of 1 rpm to about 2000 rpm. In addition flat rotating or oscillating brushes may be used. Aggression may also be changed by controlling the pressure with which the brushes are contacted with the plate precursor and/or distance of the brushes to the plate precursor surface. The brushes may be the same or different and may vary in diameter, stiffness or hardness of the bristles, density of bristles, thickness of bristles, material of bristles (e.g. aluminum, stainless steel, bras, polyethylene, polyoxymethylene, polyamide (nylon), polyester or combinations thereof), arrangement of bristles (spiral or linear), length and shape (e.g. circular, elliptical or rectangular or hexagonal cross section) of bristles or combinations thereof. The strength of aggression of the brushes (high aggression relates to removal of large portions of material) may be varied by changing it from high aggression at the beginning to low aggression at the end of the process or the opposite.

The nature of the liquid used is guided by the nature of the precursor employed. If the layer to be removed is soluble, emulsifiable or dispersible in water or aqueous solutions, water or aqueous solutions might be used as first liquid in the pre-cleaning station. If the layer is soluble, emulsifiable or dispersible in organic solvents or mixtures, organic solvents or mixtures may be used as second liquid in the pre-cleaning station. If the precursor has an aqueously developable layer, then water or predominantly aqueous solvents can be used as second liquid in the developing station. In the case of organically developable precursors different organic solvents or their mixtures may be used as second liquid in the developing station. Correspondingly the post-cleaning station may be operated with water, aqueous solution, organic solvent or mixtures of organic solvents depending on the nature of the relief layer to be cleaned as a third liquid.

The liquids may be water or aqueous solutions which may contain other ingredients e.g. salts, acids, bases, emulsifiers, dispersion aids, viscosity regulators, surfactants or combinations thereof. Salts, acids and bases may be used to control the pH of the liquid. Emulsifiers and dispersion aids may be used to enhance the capacity of material uptake of the liquids and stabilize such emulsions and dispersions. The aqueous solutions may comprise organic solvents, e.g. alcohols, esters, ethers; or hydrocarbons or combinations thereof.

The liquids may be organic solvents or mixtures thereof. For example, use may be made of developers comprising naphthenic or aromatic petroleum fractions in a mixture with alcohols, such as benzyl alcohol, cyclohexanol, or aliphatic alcohols having 5 to 10 carbon atoms, for example, and also, optionally, further components, such as, for example, alicyclic hydrocarbons, terpenoid hydrocarbons, substituted benzenes such as diisopropylbenzene, esters having 5 to 12 carbon atoms, or glycol ethers, for example. Suitable washing agents are disclosed in EP-A 332 070 or EP-A 433 374, for example. In addition the solvents and solvent mixtures may comprise other ingredients e.g. salts, acids, bases, emulsifiers, dispersion aids, viscosity regulators, antistatics, water, surfactants or combinations thereof. For reasons of safety and to reduce the cost and complexity of the apparatus involved, the temperature when using organic solvents ought to be 5° C. to 15° C. beneath the flash point of the washing agent mixture used.

The treatment compartment may be a unit using a single liquid, but can also be composed of two or more sub units which may use the same fluid or different fluids. Also the arrangement of the brushes and liquid handling systems including pumps, filters, troughs, hoses, etc. may be common or divided according to the number of subunits.

However, depending on the desired treatment, other types of treatment means may be provided in the treatment compartment 400. Various types of treatment may selected from the group comprising washing, brushing, rinsing, spraying, drying, irradiating, developing, heating, cooling, removing of material, treating with gases or liquids, sanding, cutting, treating with electromagnetic waves, and combinations thereof.

Also, the treatment in the treatment compartment 400 may be a heat treatment resulting in a liquefied part of relief plate precursor followed by contacting the liquefied part with a moving acceptor material, such as a web, a non-woven material, or a foil to which molten material adheres, and continuously removing the liquefied part with the acceptor material. Further, instead of having one treatment compartment 400, a plurality of consecutive treatment compartments may be provided.

For example, a post-treatment compartment may be provided to perform a post-treatment on the relief plate precursor, said post-treatment being selected from the group comprising washing, brushing, rinsing, spraying, drying, irradiating, developing, heating, cooling, removing of material, treating with gases or liquids, sanding, cutting, treating with electromagnetic waves and combinations thereof. The post-treatment compartment and its components may be controlled by the controller in order to adjust the conditions according to the needs. Preferably post-treatment comprises drying and/or treatment with electromagnetic waves (post exposure).

A drying station allows the complete removal of the liquid. This may be achieved by heating or by reducing pressure or a combination of both whereby the evaporation of the liquid is accelerated. Heating may be achieved with an oven, hot gas (preferably air or steam), irradiation with IR light, irradiation with microwaves or combinations thereof. Reduction of pressure may be achieved by ventilation, vacuum pumps (e.g. diffusion pump, aspirator pump, oil pump etc.) a Venturi tube or combinations thereof. Preferably heating with IR lamps or hot air is used for the drying. Drying takes place preferably at a temperature of 40° C. to 200° C., preferably at 50° C. to 160° C., more preferably at 50° C. to 100° C., most preferably at 50° C. to 80° C. Where the dimensionally stable support of the flexographic printing element is a metal support, drying may also take place at higher temperatures, up to around 160° C.

Post exposure may be used to make the surface of the developed precursor non-tacky and/or to further cure the photo curable relief layer. In this station the developed precursor is treated with electromagnetic rays, preferably using UVA or UVC light. As light sources fluorescent lamps, LEDs or flash lamps or combinations of several of these light sources may be used. Preferably, LEDs or fluorescent lamps are installed. The light sources can be connected to a control system which steers the exposure time, the wavelength in case light sources with different emission spectra are installed, the light intensity or combinations thereof.

Further, a pre-treatment compartment may be provided to perform a pre-treatment on the relief plate precursor, said pre-treatment being selected from the group comprising: cutting, ablation, exposure to electromagnetic radiation, and combinations thereof. Also during the post- and pre-treatment the printing plate precursor may remain coupled to the transport bar. The pre-treatment compartment and its components may be controlled by the controller in order to adjust the conditions according to the needs.

Preferably the pre-treating station comprises an ablation device, an exposure device or a combination of both. An ablation treatment comprises removing material from at least one layer. For example, material of at least one layer may be removed in accordance with image data. More in particular, the performing of a treatment may comprise any one of the following: exposure to electromagnetic waves; engraving, e.g. mechanical engraving; exposure to material jets, such as particle jets, fluid jets, gas jets; exposure to a plasma; exposure to a continuous web such as for thermal development; or combinations thereof. The electromagnetic waves may be e.g. any one of the following: broadband electromagnetic waves, narrow band electromagnetic waves, monochromatic electromagnetic waves, large area electromagnetic waves e.g. with a lamp, selective electromagnetic waves, e.g. emitted by a laser, waves emitted along the full axial length of the drum or along a portion of the axial length of the drum, continuous or pulsed electromagnetic waves, high or low energy electromagnetic waves, ablation or initiation electromagnetic waves, UV to IR electromagnetic waves. The wavelength of the electromagnetic waves may be in the range from 200 to 20000 nm, preferably in the range of 250 to 15000 nm, more preferably in the range of 300 to 11000 nm, most preferably in the range of 350 to 11000 nm. The total power of the electromagnetic radiation may range from low values which are enough to trigger a chemical reaction to high values causing fast heating and evaporation or ablation of material, e.g. in the range form 0.1 mW to 2000 W, preferably from 1 mW to 1000 W, more preferably from 5 mW to 7500 W, most preferably from 1 W to 200 W. Typically the ablating beams are moved over the surface in order to create an image e.g. by means of rotating mirrors or rotating the relief plate precursor on a drum.

An exposure device comprises a source for electromagnetic radiation which delivers light with the required wavelength to the front or back side of a relief precursor. Preferably the wavelength are in the UV-Vis region of the electromagnetic spectrum. The wavelength of the electromagnetic waves may be in the range from 200 to 800 nm, preferably in the range of 250 to 500 nm, more preferably in the range of 300 to 450 nm, most preferably in the range of 350 to 400 nm. The intensity of the electromagnetic radiation may range from 0.1 mW/cm$^2$ to 200 W/cm$^2$, preferably from 1 mW/cm$^2$ to 200 W/cm$^2$, more preferably from 10 mW/cm$^2$ to 200 W/cm$^2$. As light sources metal halide lamps, fluorescent lamps, LEDs or flash lamps or combinations of several of these light sources may be used. Preferably, LEDs or fluorescent lamps are installed. The light sources can be connected to the control system which steers the exposure time, the wavelength in case light sources with different emission spectra are installed, the light intensity or combinations thereof. The light source and the plate precursor may be stationary during exposure or may be in relative motion to each other during exposure. Preferably bar like LED arrays are moved across the plate precursor or the plate precursor is passed a LED array. Typically the exposure is performed through a mask which may be an integral part of the plate precursor or a separate mask layer or an electronically switchable mask (e.g. a display like device with switchable transparent and non-transparent regions or pixels). Scanning beams without the use of a mask may be used as well. The exposure compartment may be used under ambient conditions or in specific atmosphere e.g. with reduced oxygen content.

FIG. 9 illustrates in detail a plate coupling station 300 for a position where the transport bar 100 is being coupled to the forward transport mechanism 210, 220. A piston 215 pushes the transport bar 100 towards the beginning of the lead screw and engages the transport bar with the lead screw. It is noted that the relief plate precursor P is not shown in FIG. 9, but in the illustrated position normally a relief plate precursor P is coupled to the plurality of penetration elements 110.

Figures 10, 11A:
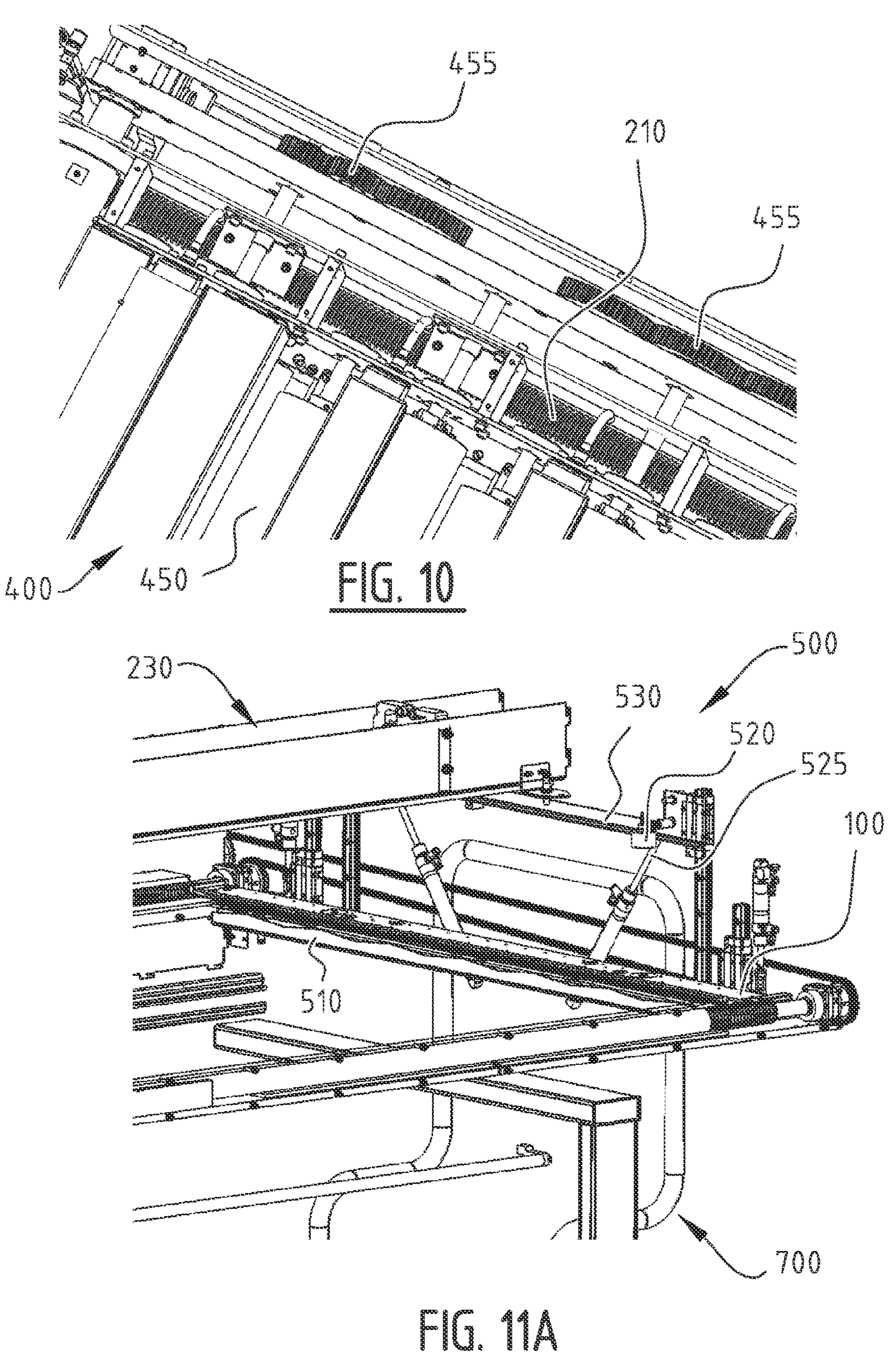
FIG. 10 is a detailed top view of a portion of the treatment compartment.
FIGS. 11A and 11B illustrate an exemplary embodiment of a plate decoupling station showing the transport bar in a low and a high position, respectively.

FIG. 10 illustrates a top view of the treatment compartment 400 with the brushes 450, and the first forward transport mechanism 210 extending on one lateral side of the treatment compartment 400. FIG. 10 further illustrates a number of coupling means 455 for driving the rotation of the brushes 450.

Figure 11B:
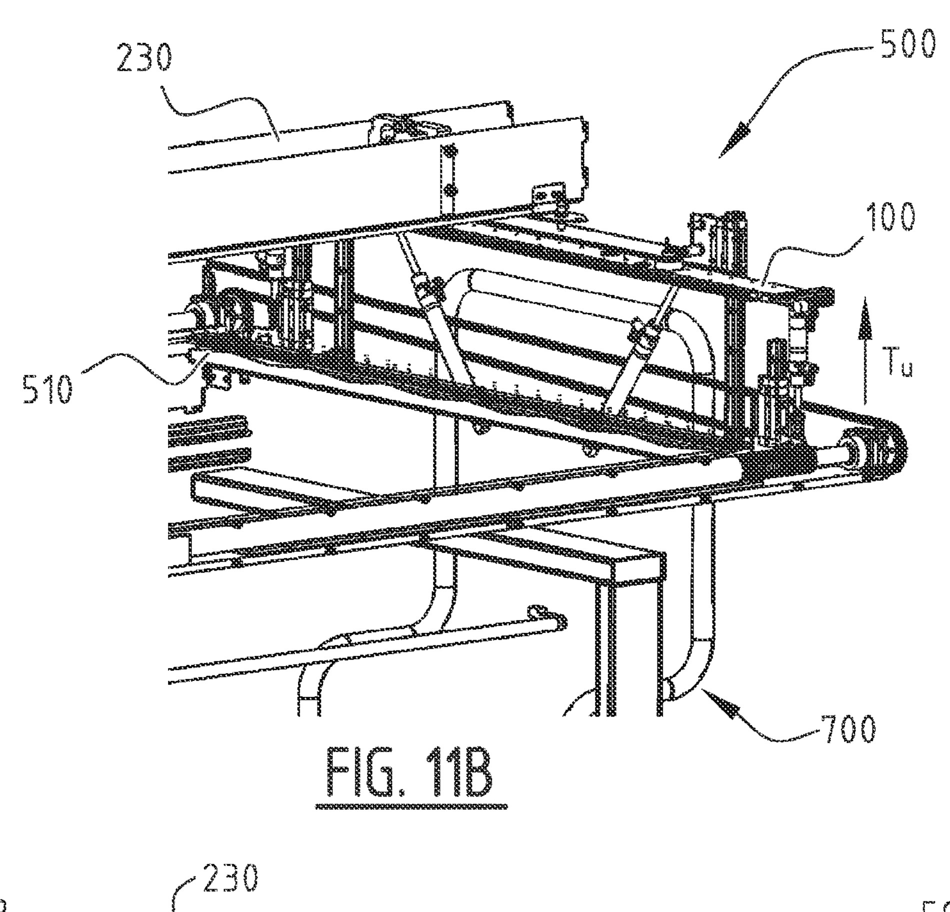
Figure 11C:
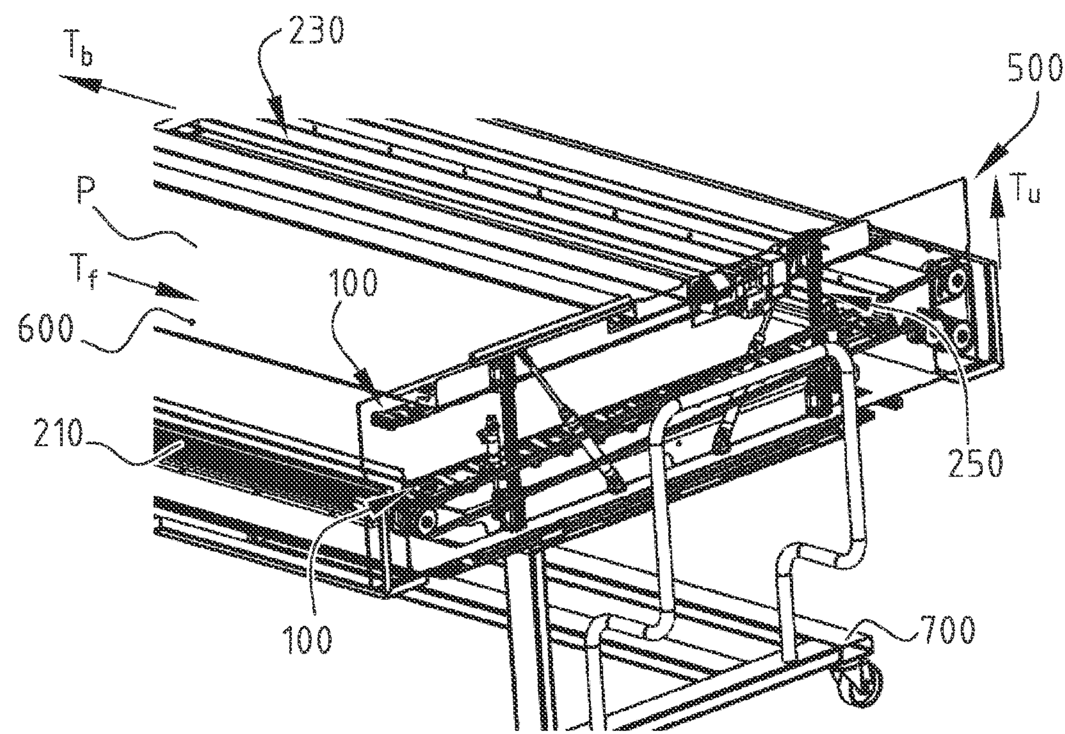
FIG. 11C shows the plate decoupling station of FIG. 11A, seen from the other side.

FIGS. 11A, 11B and 11C illustrate in detail an exemplary embodiment of a plate decoupling station 500. In FIG. 11A, the transport bar 100 is in a low position. In this position, the relief plate precursor P is decoupled from the penetration elements 110 of the transport bar 100 by the decoupling tool 510 which pushes against a lower face of the printing plate precursor, near the leading edge 3. The plate decoupling station 500 comprises a transverse member 530 provided with magnets 520 to pull the transport bar 100 upward. Air pistons 525 are provided to move the transverse member 530 with the magnets 520 up or down. Next, as illustrated in FIGS. 11B and 11C, the transport bar 100 is moved in an upward direction Tu towards the backward transport mechanism 230, and the printing plate precursor can fall down in the discharge zone 600.

A relief plate precursor generally comprises a support layer made of a first material and an additional layer made of a second material which is different from said first material. The support layer may be a flexible metal, a natural or artificial polymer, paper or combinations thereof. Preferably the support layer is a flexible metal or polymer film or sheet. In case of a flexible metal, the support layer could comprise a thin film, a sieve like structure, a mesh like structure, a woven or non-woven structure or a combination thereof. Steel, copper, nickel or aluminium sheets are preferred and may be about 50 to 1000 μm thick. In case of a polymer film, the film is dimensionally stable but bendable and may be made for example from polyalkylenes, polyesters, polyethylene terephthalate, polybutylene terephthalate, polyamides and polycarbonates, polymers reinforced with woven, nonwoven or layered fibres (e.g. glass fibres, Carbon fibres, polymer fibres) or combinations thereof. Preferably polyethylene and polyester foils are used and their thickness may be in the range of about 100 to 300 μm, preferably in the range of 100 to 200 μm.

A relief precursor may carry an additional layer. For example, the additional layer may be any one of the following: a direct engravable layer (e.g. by laser), a solvent or water developable layer, a thermally developable layer, a photosensitive layer, a combination of a photosensitive layer and a mask layer. Optionally there may be provided one or more further additional layers on top of additional layer. Such one or more further additional layers may comprise a cover layer at the top of all other layers which is removed before the imageable layer is imaged. The one or more additional layers may comprise a relief layer, and an anti-halation layer between the support layer and the relief layer or at a side of the support layer which is opposite of the relief layer. The one or more additional layers may comprise a relief layer, an imageable layer, and one or more barrier layers between the relief layer and the imageable layer which prevent diffusion of oxygen. Between the different layers described above one or more adhesion layers may be located which ensure proper adhesion of the different layers.

In a preferred embodiment the relief plate precursor comprises a support layer made of a polyester of polymer material, and an additional layer made of a directly engravable material such as a resin material. The optional layer may then be a laser ablative layer. In an exemplary embodiment the relief plate precursor may contain at least a dimensionally stable support layer, a relief layer and an imageable mask layer. Optionally, further layers may be present. There may be a cover layer at the top of all other layers which is removed before the imageable mask layer is imaged. There may be an anti-halation layer between the support layer and the relief layer or it may be located at the side of the support layer which is opposite of the relief layer. There may be one or more barrier layers between the relief layer and the imageable mask layer which prevent diffusion of oxygen. Between the different layers described above one or more adhesion layers may be located which ensure proper adhesion of the different layers. One or more layers may be removable by treatment with a liquid. The liquids used may be the same or different for different layers. Preferably the liquids used are different.

In a preferred embodiment the relief plate precursor comprises a photosensitive layer and a mask layer. The mask layer may be ablated or changed in transparency during the treatment and forms a mask with transparent and non-transparent areas. Underneath of transparent areas of the mask the photosensitive layer undergoes a change in solubility and/or fluidity upon irradiation. The change is used to generate the relief by removing parts of the photosensitive layer in one or more subsequent steps. The change in solubility and/or fluidity may be achieved by photo-induced polymerization and/or crosslinking, rendering the irradiated areas less soluble and less meltable. In other cases the electromagnetic radiation may cause breaking of bonds or cleavage of protective groups rendering the irradiated areas more soluble and/or meltable. Preferably a process using photo-induced crosslinking and/or polymerization is used.

In an embodiment the flexible plate comprises a photosensitive layer comprising at least a photo-initiator or a photo-initiator system, a binder and a reactive compound or monomer. A photo-initiator is a compound which upon irradiation with electromagnetic radiation may form a reactive species which can start a polymerization reaction, a crosslinking reaction, a chain or bond scission reaction which leads to a change of the solubility and/or meltability of the composition. Photo-initiators are known which cleave and generate radicals, acids or bases. Such initiators are known to the person skilled in the art and described e.g. in: Bruce M. Monroe et al., Chemical Review, 93, 435 (1993), R. S. Davidson, Journal of Photochemistry and Biology A: Chemistry, 73, 81 (1993), J. P. Faussier, Photoinitiated Polymerization-Theory and Applications: Rapra Review, Vol. 9, Report, RapraTechnology (1998), M. Tsunooka et al., 25 Prog. Polym. Sci., 21, 1 (1996), F. D. Saeva, Topics in Current Chemistry, 1 56, 59 (1990), G. G. Maslak, Topics in Current Chemistry, 168, 1 (1993), H. B. Shuster et al., JAGS, 112, 6329 (1990) and I. D. F. Eaton et al., JAGS, 102, 3298 (1980), P. Fouassier and J. F. Rabek, Radiation Curing in Polymer Science and Technology, pages 77 to 117 (1993) or K. K. Dietliker, Photoinitiators for free Radical and Cationic Polymerisation, Chemistry & Technology of UV & EB Formulation for Coatings, Inks and Paints, Volume, 3, Sita Technology LTD, London 1991; or R. S. Davidson, Exploring the Science, technology and Applications of U.V. and E.B. Curing, Sita Technology LTD, London 1999.Further initiators are described in JP45-37377, JP44-86516, U.S. Pat Nos. 3,567,453, 4,343,891, EP109772, EP109773, JP63138345, JP63142345, JP63142346, JP63143537, JP4642363, JP59152396, JP61151197, JP6341484, JP2249 and JP24705, JP626223, JPB6314340, JP1559174831, JP1304453 and JP1152109.

Binders are linear, branched or dendritic polymers which may be homopolymers or copolymers. Copolymers can be random, alternating or block copolymers. As binder, those polymers which are either soluble, dispersible or emulsifiable in either aqueous solutions, organic solvents or combinations of both are used. Suitable polymeric binders are those conventionally used for the production of letterpress printing plates, such as completely or partially hydrolyzed polyvinyl esters, for example partially hydrolyzed polyvinyl acetates, polyvinyl alcohol derivatives, e. g. partially hydrolyzed vinyl acetate/alkylene oxide graft copolymers, or polyvinyl alcohols subsequently acrylated by a polymer-analogous reaction, as described, for example, in EP-A-0079514, EP-A-0224164 or EP-A-0059988, and mixtures thereof. Also suitable as polymeric binders are polyurethanes or polyamides which are soluble in water or water/alcohol mixtures, as described, for example, in EP-A-00856472 or DE-A-1522444. For flexographic printing precursors elastomeric binders are used. The thermoplastic-elastomeric block copolymers comprise at least one block which consists essentially of alkenylaromatics, and at least one block which consists essentially of 1,3-dienes. The alkenylaromatics may be, for example, styrene, α-methylstyrene, or vinyltoluene. Styrene is preferable. The 1,3-dienes are preferably butadiene and/or isoprene. These block copolymers may be linear, branched, or radial block copolymers. Generally speaking, they are triblock copolymers of the A-B-A type, but they may also be diblock polymers of the A-B type, or may be polymers having a plurality of alternating elastomeric and thermoplastic blocks. A-B-A-B-A, for example. Mixtures of two or more different block copolymers may also be used. Commercial triblock copolymers frequently include certain fractions of diblock copolymers. The diene units may be 1,2- or 1,4-linked. Also possible for use, furthermore, are thermoplastic elastomeric block copolymers with styrene and blocks and a random styrene-butadiene middle block. Use may also be made, of course, of mixtures of two or more thermoplastic-elastomeric binders, provided that the properties of the relief-forming layer are not negatively impacted as a result. As well as the stated thermoplastic-elastomeric block copolymers, the photopolymerizable layer may also comprise further elastomeric binders other than the block copolymers. With additional binders of this kind, also called secondary binders, the properties of the photopolymerizable layer can be modified. Examples of a secondary binder are vinyltoluene-a-methylstyrene copolymers. These polymer binders account for in general from 20 to 98%, preferably from 50 to 90, % by weight of the total amount of the layer.

Reactive compounds or monomers which are suitable for the preparation of the mixtures are those which are polymerizable and are compatible with the binders. Useful monomers of this type generally have a boiling point above 100° C. They usually have a molecular weight of less than 3000, preferably less than 2000. The ethylenically unsaturated monomers used ought to be compatible with the binders, and they have at least one polymerizable, ethylenically unsaturated group. As monomers it is possible in particular to use esters or amides of acrylic acid or methacrylic acid with mono- or polyfunctional alcohols, amines, aminoalcohols or hydroxyethers and hydroxyesters, esters of fumaric acid or maleic acid, and allyl compounds. Esters of acrylic acid or methacrylic acid are preferred. Preference is given to 1,4-butanediol diacrylate, 1,6-hexanediol diacrylate, 1,6-hexanediol dimethacrylate, 1,9-nonanediol diacrylate, or trimethylolpropane tri(meth)acrylate. Mixtures of different monomers can of course be used. The total amount of all the monomers used in the relief-forming layer together is generally 1 to 20 wt %, preferably 5 to 20 wt %, based in each case on the sum of all the constituents of the relief-forming layer. The amount of monomers having two ethylenically unsaturated groups is preferably 5 to 20 wt %, based on the sum of all constituents of the relief-forming layer, more preferably 8 to 18 wt %.

The photosensitive layer may comprise further components. The further components are selected from the group consisting of a further polymer, a filler, a plasticizer, an anti-blocking agent, a monomer, an additive (e.g. a stabilizer, a dye), a stabilizer, a crosslinker, a binder, a color forming compound, a dye, a pigment, an antioxidant and combinations thereof.

In a further embodiment the flexible plate comprises a photosensitive layer as described above and a mask layer, the mask layer comprising at least a compound capable of absorbing electromagnetic radiation and a component capable of being removed by ablation (also known as digital plate precursor). Preferably the mask layer is an integral layer of the relief precursor and is in direct contact with the photosensitive layer or with a functional layer disposed between photosensitive layer and mask layer. This functional layer is preferably a barrier layer and blocks oxygen. The mask layer may be imageable by ablation and removable by solvents or by thermal development. The mask layer is heated and removed by irradiation with high energy electromagnetic radiation, whereby an imagewise structured mask is formed, which is used to transfer the structure onto the relief precursor. In order to do so the mask layer may be non-transparent in the UV region and absorb radiation in the VIS-IR region of the electromagnetic spectrum. The VIS-IR radiation may then be used to heat and ablate the layer. The optical density of the mask layer in the UV region between 330 and 420 nm is in the range of 1 to 5, preferably in the range of 1.5 to 4 and more preferably in the range of 2 to 4.

The layer thickness of the alatable mask layer may be in the range of 0.1 to 5 μm, preferably 0.3 to 4 μm, more preferably 1 to 3 mm. The laser sensitivity of the mask layer (measured as energy needed to ablate 1 $cm^2$) may be in the range of 0.1 to 10 $mJ/cm^2$, preferably in the range of 0.3 to 5 $mJ/cm^2$, most preferably in the range of 0.5 to 5 $mJ/cm^2$.

Whilst the principles of the invention have been set out above in connection with specific embodiments, it is to be understood that this description is merely made by way of example and not as a limitation of the scope of protection which is determined by the appended claims.

The invention claimed is:

1. An apparatus for preparing a relief plate precursor that has to be treated, comprising:

a transport bar provided with at least one pin-like penetration element having a sharp tip, the transport bar comprising a beam part, wherein the at least one pin-like penetration element points upward;

a plate coupling station configured for arranging the relief plate precursor on the at least one pin-like penetration element and for coupling the relief plate precursor to the transport bar by causing a penetration by the at least one pin-like penetration element through an unperforated area near an edge of the relief plate precursor, such that the at least one pin-like penetration element extends from a first side of the relief plate precursor through the relief precursor and protrudes at a second side of the relief precursor;

wherein the plate coupling station comprises at least one actuator connected to a hammer tool for pushing the at least one penetration element through the material of the relief plate precursor;

wherein the at least one actuator is configured for moving the hammer tool downward, wherein the hammer tool is located above the beam part of the transport bar when the transport bar is in the coupling station, said hammer tool being configured for pushing the relief precursor on the at least one pin-like penetrating element, wherein the hammer tool is configured to abut against the beam part of the transport bar.

2. The apparatus according to claim 1, wherein the shape of the at least one penetration element comprises a rod with a round, elliptical, triangular, rectangular or multi-angular cross section.

3. The apparatus according to claim 1, wherein each penetration element comprises a penetration portion extending in a penetration direction and having a length between 1 mm and 20 mm.

4. The apparatus according to claim 1, wherein the length of the transport bar is from 100 mm to 10000 mm.

5. The apparatus according to claim 1, wherein the at least one penetration element is made of metal or an alloy.

6. The apparatus according to claim 1, further comprising a treatment compartment configured for treating the relief plate precursor, whilst the relief plate precursor is being transported coupled to the transport bar.

7. The apparatus according to claim 1, further comprising a plate decoupling station configured for decoupling the treated relief plate precursor from the transport bar; wherein the plate decoupling station comprises at least one actuator connected to a tool configured for pushing the relief plate precursor away from the transport bar such that the at least one penetration element is moved out of the relief plate precursor.

8. The apparatus according to claim 7, further comprising a further transport bar, a plate decoupling station configured for decoupling the treated relief plate precursor from the transport bar, and a transport system, wherein the transport system is configured to move each transport bar, after being coupled to a relief plate precursor in the plate coupling station, from the plate coupling station through the treatment compartment to the plate decoupling station, and, after being decoupled from a treated printing plate, from the plate decoupling station back to the plate coupling station; wherein the transport system is configured to move the transport bar and the further transport bar in a closed loop through the apparatus.

9. The apparatus according to claim 1, wherein the hammer tool comprises at least one hole configured for receiving the at least one pin-like penetration element.

10. An apparatus for preparing a relief plate precursor that has to be treated, comprising:

a transport bar provided with at least one penetration element;

a plate coupling station configured for coupling the relief plate precursor to the transport bar by causing a penetration by the at least one penetration element through an unperforated area near an edge of the relief plate precursor;

a treatment compartment configured for treating the relief plate precursor with a liquid, whilst the relief plate precursor is being transported coupled to the transport bar, wherein the treatment compartment has an inlet and an outlet, the plate coupling station being located upstream of the inlet of the treatment compartment;

a plate decoupling station configured for decoupling the treated relief plate precursor from the transport bar, the plate decoupling station being located downstream of the outlet of the treatment compartment, and a transport system, wherein the transport system is configured to move each transport bar, after being coupled to a relief plate precursor in the plate coupling station, from the plate coupling station through the treatment compartment to the plate decoupling station, and, after being decoupled from a treated printing plate, from the plate decoupling station back to the plate coupling station;

wherein the transport system comprises a forward transport mechanism configured to transport the transport bar with the coupled relief plate precursor at least from an inlet side to an outlet side of the treatment compartment, and from the outlet side to the plate decoupling station, wherein the forward transport mechanism comprises a first and/or second lead screw; and wherein the first and/or second end of the transport bar is provided with a first and/or second coupling portion configured to be coupled to the first and/or second lead screw, respectively:

wherein the transport system comprises a backward transport mechanism configured to transport the transport bar from the plate decoupling station back to the plate coupling station, wherein the backward transport mechanism is located partly above or below the treatment compartment, wherein the transport system comprises an upward or downward transport mechanism configured to move a decoupled transport bar in the plate decoupling station upward or downward toward the backward transport mechanism;

wherein a plate discharge zone is provided between an outlet side of the treatment compartment and the plate decoupling station such that a relief plate precursor is pulled fully out of the treatment compartment in the plate discharge zone before being decoupled from the transport bar in the plate decoupling station.

11. The apparatus according to claim 10, wherein the transport system further comprises a bar coupling means configured to couple the transport bar with coupled relief plate precursor to the forward transport mechanism.

12. The apparatus according to claim 10, wherein the forward transport mechanism comprises a first and/or second chain or belt or linear motor; and wherein the first and/or second end of the transport bar is provided with a first and/or second coupling portion configured to be coupled to the first and/or second chain or belt or linear motor, respectively.

13. The apparatus according to claim 10, wherein the backward transport mechanism comprises any one of the following: one or more belts, one or more chains, one or more lead screws, a linear motor, or combinations thereof.

14. The apparatus according to claim 10, wherein the backward transport mechanism is located around the treatment compartment, and wherein the transport system comprises an additional transport mechanism configured to move a decoupled transport bar in the plate decoupling station toward the backward transport mechanism.

15. The apparatus according to claim 10, further comprising a further transport bar and a control unit configured to control the transport system, such that when the transport bar moves through the treatment compartment, the further transport bar moves back to the plate coupling station.

16. The apparatus according to claim 10, further comprising a removal means configured to remove a treated relief plate precursor after being decoupled from the transport bar in the plate decoupling station.

17. The apparatus according to claim 10, further comprising a removal means configured to remove a treated relief plate precursor after being decoupled from the transport bar in the plate decoupling station wherein the removal means comprises any one or more of the following: a carrier or a trolley configured for receiving the treated relief plate precursor in the plate discharge zone and for being moved out of the plate discharge zone; a robot; a moving belt; at least one rotating drum.

* * * * *